(12) United States Patent
Toubeix et al.

(10) Patent No.: US 12,355,447 B2
(45) Date of Patent: Jul. 8, 2025

(54) ELECTRONIC CIRCUIT FOR PROVIDING A DIGITAL SIGNAL WITH RAMPS

(71) Applicant: Commissariat à l'Energie Atomique et aux Energies Alternatives, Paris (FR)

(72) Inventors: Mathieu Toubeix, Grenoble (FR); Eric Guthmuller, Grenoble (FR); Adrian Evans, Grenoble (FR)

(73) Assignee: Commissariat à l'Energie Atomique et aux Energies Alternatives, Paris (FR)

(*) Notice: Subject to any disclaimer, the term of this patent is extended or adjusted under 35 U.S.C. 154(b) by 58 days.

(21) Appl. No.: 18/428,528

(22) Filed: Jan. 31, 2024

(65) Prior Publication Data

US 2024/0259003 A1 Aug. 1, 2024

(30) Foreign Application Priority Data

Feb. 1, 2023 (FR) .................................... 2300946
Feb. 14, 2023 (FR) .................................... 2301359

(51) Int. Cl.
*G06N 10/40* (2022.01)
*H03K 4/08* (2006.01)

(52) U.S. Cl.
CPC ............... *H03K 4/08* (2013.01); *G06N 10/40* (2022.01)

(58) Field of Classification Search
CPC ............ G06N 10/40; H03K 4/06; H03K 4/08
USPC ........................................ 327/131, 134, 135
See application file for complete search history.

(56) References Cited

U.S. PATENT DOCUMENTS

| 4,520,450 A | 5/1985 | Snedden et al. |
| 5,001,660 A | 3/1991 | Adcock et al. |
| 5,151,797 A * | 9/1992 | Nosaki ................. H04N 1/3247 358/448 |

(Continued)

FOREIGN PATENT DOCUMENTS

| CN | 113434006 A | 9/2021 |
| GB | 2213335 A | 8/1989 |

OTHER PUBLICATIONS

Snoeij, Martijn F., Albert JP Theuwissen, Kofi AA Makinwa, and Johan H. Huijsing. "Multiple-ramp column-parallel ADC architectures for CMOS image sensors." IEEE Journal of Solid-State Circuits 42, No. 12 (2007): 2968-2977.

(Continued)

*Primary Examiner* — William Hernandez
(74) *Attorney, Agent, or Firm* — Jordan IP Law, LLC

(57) ABSTRACT

The present description concerns an electronic circuit (10) for providing a digital signal (Sn) comprising a succession of ramps, the electronic circuit being clocked by a clock signal, the electronic circuit being configured to supply a number Nout of digital values of the digital signal at each cycle of the clock signal, Nout being greater than 1. The electronic circuit comprises a first memory (30) in which are stored, for each ramp, first data, and a second memory (32) in which are stored second data relative to the numbers of cycles of the clock signal over which some of the ramps extend, and a first circuit (40) configured to read from the first memory the first data relative to a plurality of successive ramps and from the second memory the second data associated with said plurality of successive ramps, and to supply said digital values.

14 Claims, 11 Drawing Sheets

(56) References Cited

U.S. PATENT DOCUMENTS

| | | | |
|---|---|---|---|
| 5,347,176 A | 9/1994 | Bloom | |
| 6,191,820 B1* | 2/2001 | Kang | H04N 3/22 |
| | | | 348/E7.012 |
| 9,219,487 B1 | 12/2015 | Stuhlberger et al. | |
| 2005/0018779 A1* | 1/2005 | Griffin | H04L 25/4904 |
| | | | 375/259 |
| 2009/0231479 A1 | 9/2009 | Zarnowski et al. | |
| 2011/0001039 A1* | 1/2011 | Hoshino | H04N 25/767 |
| | | | 257/E27.13 |
| 2011/0115663 A1* | 5/2011 | Bogaerts | H03M 1/123 |
| | | | 341/164 |
| 2012/0154005 A1 | 6/2012 | Frederiksen et al. | |
| 2015/0116012 A1 | 4/2015 | Lakdawala et al. | |
| 2016/0277546 A1* | 9/2016 | Unhold | H03L 7/1976 |

OTHER PUBLICATIONS

Preliminary Search Report for French Application No. 2301359; dated Dec. 18, 2023; 2 pages.

* cited by examiner

ELECTRONIC CIRCUIT FOR PROVIDING A DIGITAL SIGNAL WITH RAMPS

FIELD

The present patent application claims the priority benefit of French patent applications FR2301359 and FR2300946, which will be incorporated herein by reference.

BACKGROUND

The present disclosure generally concerns circuits for providing digital signals with ramps. For certain applications, it is desired to obtain an electronic circuit enabling to provide a digital signal corresponding to a succession of ramps. An example of application concerns the control of quantum bit storage cells by an analog control signal obtained by digital-to-analog conversion of the digital signal. For such applications, it may be desirable to be able to modify in a simple way the succession of ramps of the digital signal. It may further be desirable for the digital signal to be supplied at high frequency, that is, with a fine temporal accuracy.

However, it may be desirable to use an electronic circuit clocked by a clock signal at a frequency lower than the desired granularity of the digital signal.

SUMMARY

An embodiment overcomes all or part of the disadvantages of known circuits for providing digital signals with ramps.

An embodiment provides an electronic circuit for providing a digital signal comprising a succession of ramps, the electronic circuit being clocked by a clock signal, the electronic circuit being configured to supply a number Nout of digital values of the digital signal at each cycle of the clock signal, Nout being greater than 1, the electronic circuit comprising a first memory in which are stored, for each ramp, first data comprising a start value of the ramp, the slope of the ramp, and a remaining duration of the ramp in the last cycle of the clock signal in which the ramp extends, and a second memory in which are stored second data relative to the numbers of cycles of the clock signal over which some of the ramps extend, and a first circuit configured to read from the first memory the first data relative to a plurality of successive ramps and from the second memory the second data associated with said plurality of successive ramps, and to supply said digital values based on the first and second read data.

According to one embodiment, the first circuit is configured to read in parallel from the first memory the first data relative to Nout successive ramps, to read from the second memory the second data associated with said Nout successive ramps, and to supply, at a cycle of the clock signal, Nout digital values of the digital signal forming part of from one to Nout ramps among said Nout ramps.

According to an embodiment, the first circuit comprises Nout interpolation circuits in parallel, each interpolation circuit being configured to calculate, at a cycle of the clock signal, one of the Nout digital values of the digital signal forming part of from one to Nout ramps among said Nout successive ramps.

According to an embodiment, the first data stored in the first memory comprise, for each ramp, coefficients of a polynomial of a degree greater than or equal to 2, the slope of the ramp being the coefficient of degree 1 of the polynomial, the first circuit being configured to supply said digital values of ramps corresponding to polynomial functions.

According to an embodiment, Nout is a power of two, in particular 2, 4, 8, or 16.

According to an embodiment, the first circuit is configured to read, from the first memory, simultaneously the first data of Nout successive ramps.

According to an embodiment, the first circuit is configured to read, from the second memory, simultaneously the second data of Nout successive ramps.

According to an embodiment, the first circuit comprises a first module configured to supply, at each cycle of the clock signal, sets of data, each set comprising a start value of the ramp, the slope of the ramp, and a delay, the delay varying from one set to the other, and a second module configured, for each set, to supply a digital signal value equal to the sum of the start value of the ramp and of the product of the slope of the ramp and of the delay.

According to an embodiment, the first memory comprises Nout memory blocks in parallel.

According to an embodiment, the electronic circuit comprises a third memory in which are stored, for each ramp in the succession of ramps, third data comprising the start value of the ramp, the end value of the ramp, and the duration of the ramp, the electronic circuit further comprising a second circuit configured to supply, based on the third data, the first data and the second data, and to write the first data into the first memory and to write the second data into the second memory.

According to an embodiment, the second circuit is configured to process the third data in batches of Nout successive ramps.

According to an embodiment, the second circuit comprises a third module configured to determine, for each ramp, the slope of the ramp, and a fourth module configured to determine the total duration elapsed from the beginning of the succession of ramps to the end of the ramp and the number of cycles of the clock signal contained in said total duration.

An embodiment also provides a system comprising the electronic circuit such as previously defined, a digital-to-analog converter configured to convert the digital signal into an analog signal, and quantum bit storage cells receiving the analog signal.

An embodiment also provides a method of supplying a digital signal comprising a succession of ramps comprising the supply, at each cycle of a clock signal, of a number Nout of digital values of the digital signal, Nout being greater than 1, the method comprising the provision of a first memory in which are stored, for each ramp, first data comprising a start value of the ramp, the slope of the ramp, and a remaining duration of the ramp in the last cycle of the clock signal in which the ramp extends, the provision of a second memory in which are stored second data relative to the numbers of cycles of the clock signal over which some of the ramps extend, the reading, from the first memory, of the first data relative to a plurality of successive ramps and, from the second memory, of the second data associated with said plurality of successive ramps, and the supply of said digital values based on the first and second read data.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DETAILED DESCRIPTION OF THE PRESENT EMBODIMENTS

Like features have been designated by like references in the various figures. In particular, the structural and/or functional features that are common among the various embodiments may have the same references and may dispose identical structural, dimensional and hardware properties. For the sake of clarity, only the steps and elements that are useful for the understanding of the described embodiments have been illustrated and described in detail.

Unless specified otherwise, the expressions "about", "approximately", "substantially", and "in the order of" signify plus or minus 10%, preferably of plus or minus 5%.

In the rest of the disclosure, there is called ramp a signal corresponding to a polynomial function starting from a start value Start_val to reach an end value End_val within a duration Duration, and there is called waveform a set of successive ramps. In particular, the ramp is called a linear ramp when the signal starting from the start value Start_val to reach the end value End_val is linear, and the ramp is called a non-linear ramp when the signal starting from the start value Start_val to reach the end value End_val is non-linear.

An electronic circuit is said to execute or play a waveform when it provides a succession of digital values of a digital signal which, after an digital-to-analog conversion, results in an analog signal having a graphic representation corresponding to the waveform.

Figure 1:
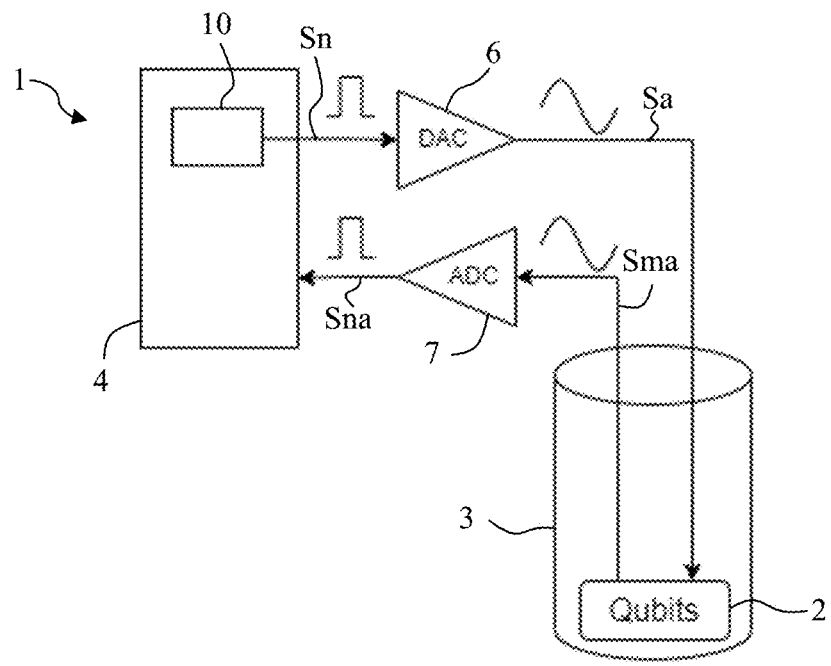
FIG. 1 shows a quantum bit control and measurement system.

FIG. 1 shows an embodiment of a system 1 comprising:
cells for storing quantum bit 2 (Qubits);
a cold chamber 3 containing the quantum bit storage cells 2;
a processing device 4 configured to supply a digital signal Sn;
a digital-to-analog converter 6 (DAC) which receives digital signal Sn and supplies an analog signal Sa for exciting the quantum bit storage cells 2; and
an analog-to-digital converter 7 (ADC) which receives an analog measurement signal Sma from the quantum bit storage cells 2 and converts it into a digital measurement signal Sna transmitted to processing device 4.

Processing device 4 comprises an electronic circuit 10 configured to execute a waveform and to supply digital signal Sn. As an example, electronic circuit 10 corresponds to a programmable logic circuit, in particular a field-programmable gate array (FPGA), or an application-specific integrated circuit (ASIC).

The electronic circuit 10 configured to execute a waveform is clocked by a clock signal having a frequency fhard and a period Thard. According to an embodiment, electronic circuit 10 provides, at each clock cycle of duration Thard, called hardware cycle hereafter, a number Nout of successive digital values of digital signal Sn corresponding to the waveform. Nout is an integer greater than or equal to 1, and is called oversampling factor. According to an embodiment, Nout is a power of 2. There is called fdac the frequency equal to the product of frequency fhard and of oversampling factor Nout, and there is called Tdac the duration equal to the ratio of period Thard to oversampling factor Nout. In the embodiment illustrated in FIG. 1, the digital values of digital signal Sn corresponding to the waveform are supplied to digital-to-analog converter 6, which is clocked by a clock signal having frequency fdac and period Tdac.

Each ramp of the waveform is defined by its start value Start_val, its end value End_val, and its duration Duration, which is expressed in number of periods Tdac. The data items Start_val, End_val, and Tdac of the ramps of the waveform are altogether called raw parameters of the waveform. Each ramp of the waveform may extend over less than one hardware cycle, over more than one hardware cycle, start in one hardware cycle and end in another hardware cycle, etc. This especially means that, for each ramp, the starting of the ramp may coincide with the starting of a hardware cycle or occur during a hardware cycle, and that the end of the ramp may coincide with the end of a hardware cycle or occur during a hardware cycle. Further, the hardware cycle of the start of the ramp may be the same as the hardware cycle of the end of the ramp, or it may be different from the hardware cycle of the end of the ramp.

Figure 2:
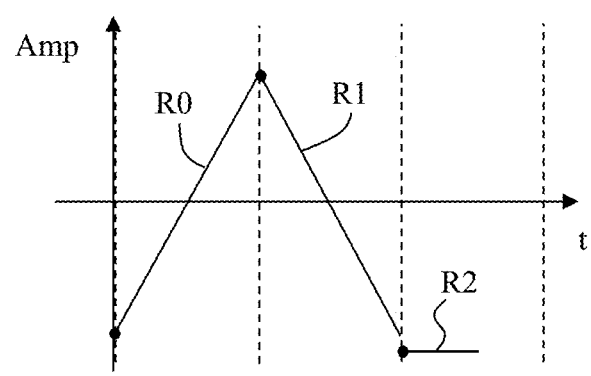
FIG. 2, FIG. 3, FIG. 4, FIG. 5, and FIG. 6 show examples of waveforms.
Figure 3:
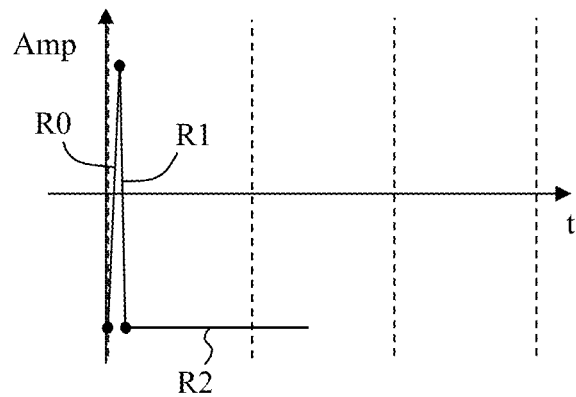
Figure 4:
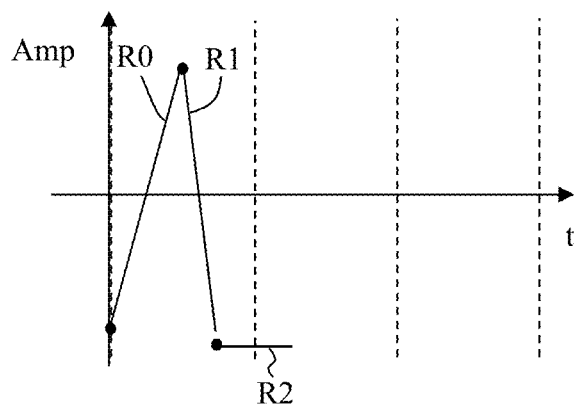
Figure 5:
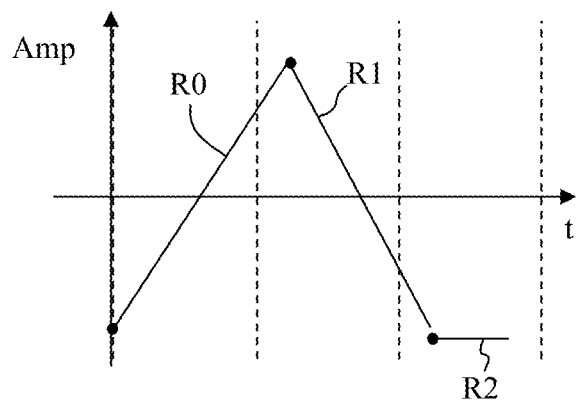

Examples of waveforms will now be described for linear ramps. FIG. 2, FIG. 3, FIG. 4, FIG. 5, and FIG. 6 show examples of waveforms, for example curves of variation of the amplitude Amp of a voltage as a function of time t. In FIG. 2, FIG. 3, FIG. 4, the waveform comprises three successive ramps R0, R1, and R2, and, in FIG. 6, the waveform comprises four successive ramps R0, R1, R2, and R3. In FIGS. 2 to 6, the hardware operating cycles of electronic circuit 10 have been shown in dotted lines.

The raw parameters of the waveforms shown in FIGS. 2 to 6 are respectively gathered in tables Table 1 to Table 5 hereafter. For FIGS. 2 to 5, Nout is equal to 16. For FIG. 6, Nout is equal to 4. The raw parameters of the waveform have been added in FIG. 6.

TABLE 1

Raw parameters

| Ramp | Start_val | End_val | Duration |
|---|---|---|---|
| R0 | −4,500 | 4,500 | 16 |
| R1 | 4,500 | −4,500 | 16 |
| R2 | −4,600 | −4,600 | 8 |

TABLE 2

Raw parameters

| Ramp | Start_val | End_val | Duration |
|---|---|---|---|
| R0 | −4,500 | 4,500 | 1 |
| R1 | 4,500 | −4,500 | 1 |
| R2 | −4,600 | −4,600 | 24 |

TABLE 3

Raw parameters

| Ramp | Start_val | End_val | Duration |
|---|---|---|---|
| R0 | −4,500 | 4,500 | 8 |
| R1 | 4,500 | −4,500 | 3 |
| R2 | −4,600 | −4,600 | 7 |

TABLE 4

Raw parameters

| Ramp | Start_val | End_val | Duration |
|---|---|---|---|
| R0 | −4,500 | 4,500 | 18 |
| R1 | 4,500 | −4,500 | 15 |
| R2 | −4,600 | −4,600 | 7 |

TABLE 5

Raw parameters

| Ramp | Start_val | End_val | Duration |
|---|---|---|---|
| R0 | 0 | 4,192 | 11 |
| R1 | 4,192 | 1,290 | 2 |
| R2 | 1,290 | 2,902 | 1 |
| R3 | 2,902 | 0 | 7 |

It should be noted that for the waveforms shown in FIGS. 3, 4, 5, and 6, certain ramps do not start and/or do not end at the end of a hardware cycle. Thereby, an electronic circuit clocked by a clock signal at frequency fhard and only implementing an interpolation algorithm cannot execute these waveforms.

According to an embodiment, two sets of data are determined based on the raw parameters of the waveform, the first set of data is called data parameters of the waveform and the second set of data is called control parameters of the waveform.

Figure 6:
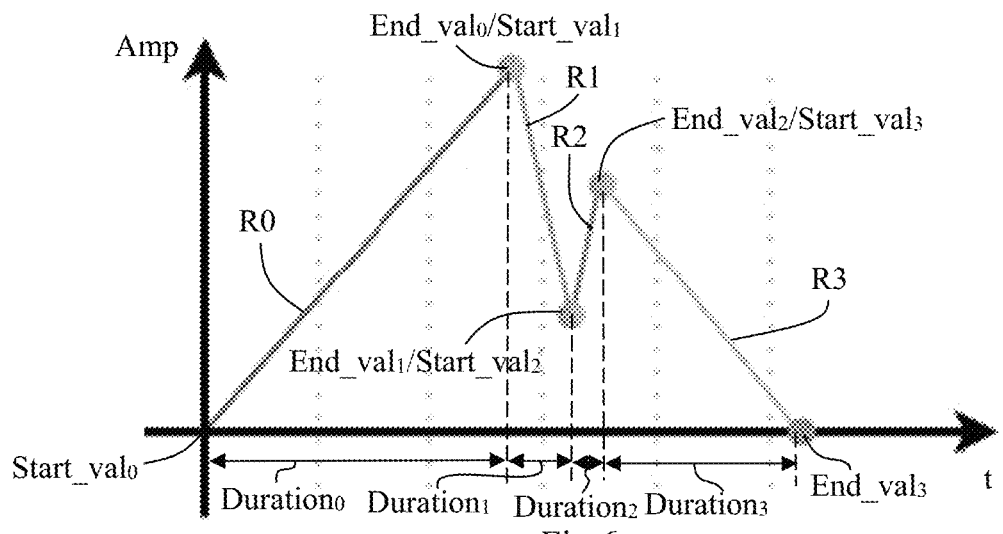

The data parameters of the waveform comprise, for each ramp of the waveform, the start value Start_val of the ramp, the slope of the ramp, called "Coeff", and the number of periods Tdac, called Rest, in the last hardware cycle over which the ramp extends since the beginning of this last hardware cycle. The data parameters of the waveform shown in FIG. 6 are gathered in Table 6 hereafter.

TABLE 6

Data parameters

| Ramp | Start_val | Coeff | Rest |
|---|---|---|---|
| R0 | 0 | 381.09 | 3 |
| R1 | 4,192 | −1,451 | 1 |
| R2 | 1,290 | 1,612 | 2 |
| R3 | 2,902 | −414.57 | 1 |

Figure 7:
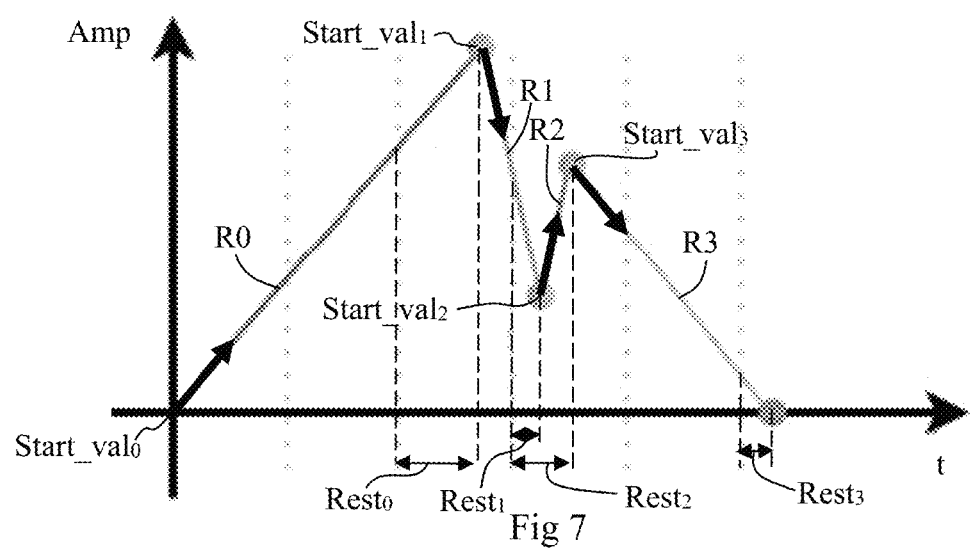
FIG. 7 shows the waveform of FIG. 6, having the data parameters of the waveform indicated thereon.

FIG. 7 shows the waveform of FIG. 6, on which the data parameters of the waveform have been indicated.

The control parameters of the waveform enable to gather the ramps in groups of successive ramps. When a ramp ends in the middle of a hardware cycle, it must be possible to complete the current hardware cycle with a number of ramps. These ramps represent a group. This group will be played for a number of hardware cycles, which corresponds to a control parameter Cycles. When it ends, the system must obtain the information of where the beginning of the next ramp group to be played is, via control parameter Index. The control parameters of the waveform shown in FIG. 6 are gathered in Table 7 hereafter.

TABLE 7

Control parameters

| Cycles | Index |
|---|---|
| 2 | 1 |
| 0 | 2 |
| 1 | — |

Figure 8:
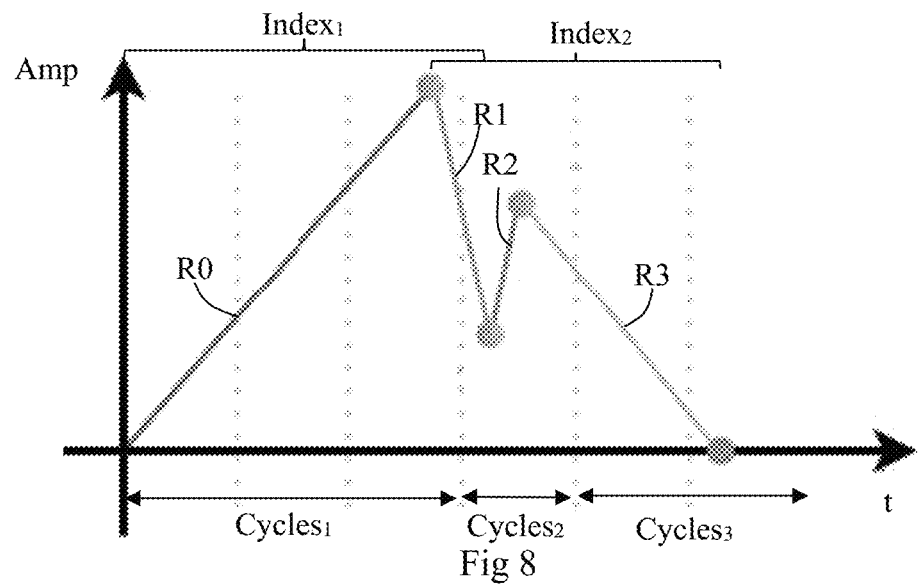
FIG. 8 shows the waveform of FIG. 7, on which the control parameters of the waveform have been indicated.

FIG. 8 shows the waveform of FIG. 6 on which the control parameters of the waveform have been illustrated.

An embodiment of an electronic circuit configured to execute a waveform based on the raw parameters of the waveform will now be described in the case of a waveform comprising linear ramps.

Figure 9:
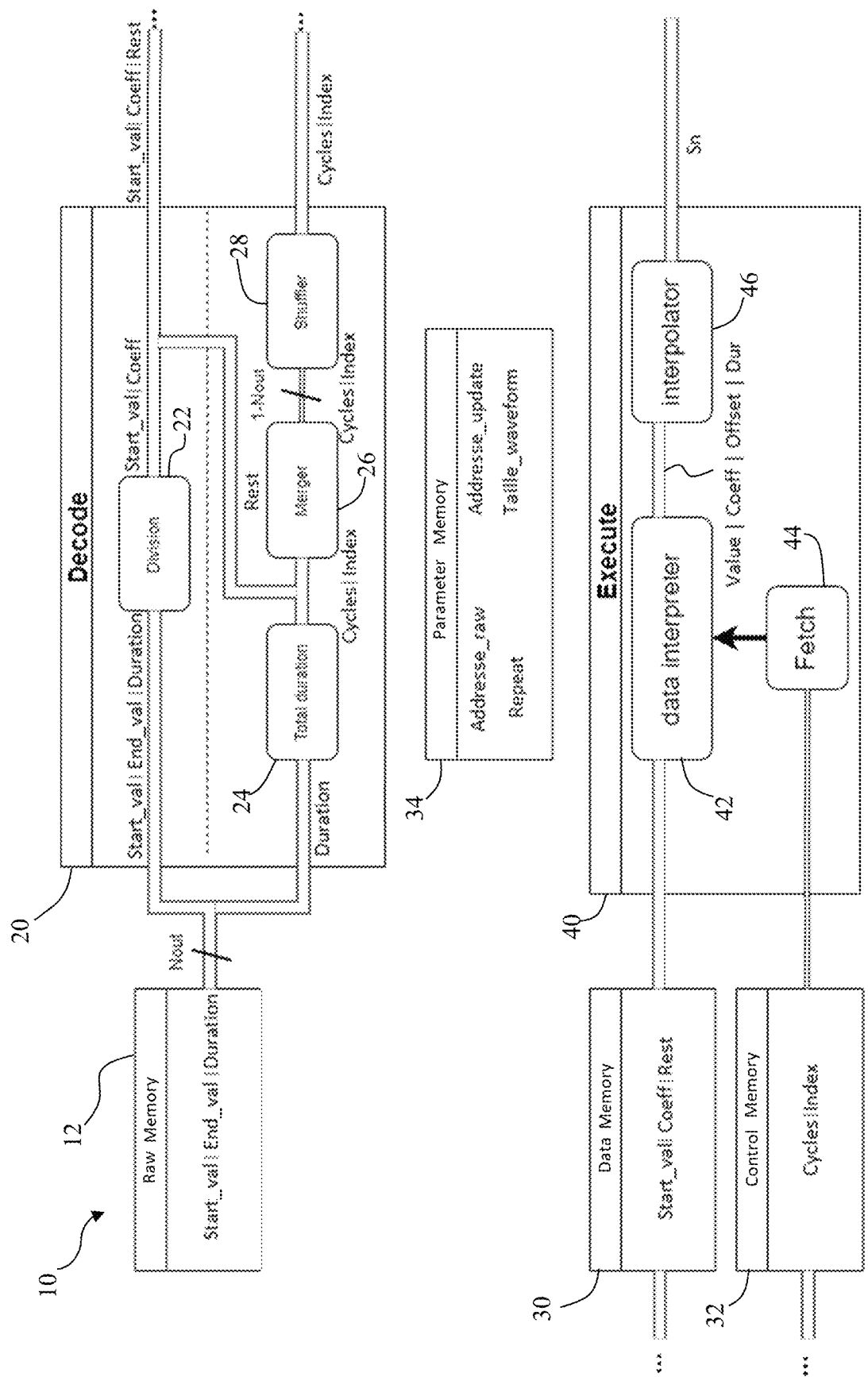
FIG. 9 schematically shows an embodiment of an electronic circuit configured to execute a waveform.

FIG. 9 schematically shows an embodiment of electronic circuit 10 configured to execute a waveform based on the raw parameters of the waveform.

Electronic circuit 10 comprises:
 a memory 12 (raw memory) having the raw parameters of the waveform, Start_val, End_val, Duration, stored therein;
 a decoding circuit 20 (Decode) configured to supply the data parameters Start_val, Coeff, Rest and the control parameters Cycles, Index of the waveform based on the raw parameters of the stored in memory 12;
 a memory 30 (Data memory), also called data memory 30, having the data parameters Start_val, Coeff, Rest of the waveform supplied by decoding circuit 20 stored therein;
 a memory 32 (Control memory), also called control memory 32, having the control parameters Cycles, Index of the waveform supplied by decoding circuit 20 stored therein; and
 an execution circuit 40 (Execute) configured to determine the successive digital values of the digital signal Sn corresponding to the waveform based on the data parameters Start_val, Coeff, Rest stored in data memory 30 and on the control parameters Cycles, Index stored in control memory 32.

According to an embodiment, electronic circuit 10 further comprises a memory 34 (Parameter memory) in which are stored, for each waveform, configuration parameters of the waveform Repeat, Taille_waveform and the addresses Addresse_raw at which to start the reading in memory 12 and the addresses Addresse_update at which to start the reading in memories 30 and 32.

Decoding circuit 20 comprises:
- a dividing module 22 (Division) configured to receive the raw parameters Start_val, End_val, Duration stored in memory 12 and to provide data parameters Start_val, and Coeff;
- a duration calculation module 24 (Total duration) configured to receive the raw parameters Duration stored in memory 12, to determine the total duration of each waveform ramp, and to supply data parameter Rest and control parameters Cycles, Index;
- a merger module 26 (Merger) configured to receive the control parameters Cycles, Index determined by duration calculation module 24, and to supply the modified control parameters Cycles, Index; and
- a shuffler module 28 (Shuffler) configured to receive the control parameters Cycles, Index determined by merger module 26 and to supply the modified control parameters Cycles, Index.

Execution circuit 40 comprises:
- an interpretation module 42 (data interpreter) receiving the data parameters Start_val, Coeff, and Rest of the waveform to be executed stored in data memory 30, and supplying data Value, Coeff, Offset, and Dur;
- a fetch module 44 (Fetch) receiving the control parameters Cycles and Index stored in control memory 32 and controlling the operation of interpreter module 42; and
- an interpolation module 46 (interpolator) configured to receive the data Value, Coeff, Offset, and Dur supplied by interpretation module 42 and to provide the digital values of digital signal Sn corresponding to the waveform.

An embodiment of a method of supplying the data parameters Start_val, Coeff, and Rest and the control parameters Cycles and Index of a waveform by decoding circuit 20 based on the raw parameters Start_val, End_val, Duration of the waveform will now be described. According to an embodiment, decoding circuit 20 processes the raw parameters stored in memory 12 in batches and simultaneously reads the raw parameters relative to Nout successive ramps of the waveform.

For each ramp of the Nout successive ramps of the waveform, dividing module 22 determines the data parameter Coeff of the ramp by determining the difference between the end value End_val and the start value Start_val of the ramp and by dividing this difference by the duration Duration of the ramp. The data parameters Coeff of the Nout successive ramps of the waveform are thus obtained.

For each ramp of the Nout successive ramps of the waveform, duration calculation module 24 determines data element Total and data parameter Rest. Data element Total is equal to the number of hardware cycles which have fully elapsed from the start of the first ramp in the batch of Nout ramps to the end of the considered ramp. Data parameter Rest is equal to 0 in the case where the considered ramp ends at the same time as a hardware cycle, and is equal to the number of periods Tdac in the last hardware cycle over which the considered ramp extends since the beginning of this last cycle in the case where the considered ramp does not end at the same time as a hardware cycle. In the case of the waveform shown in FIG. 6, duration calculation module 24 provides the data gathered in Table 8 hereafter:

TABLE 8

| Ramp | Duration calculation module | |
|---|---|---|
| | Total | Rest |
| R0 | 2 | 3 |
| R1 | 3 | 1 |
| R2 | 3 | 2 |
| R3 | 5 | 1 |

According to an embodiment, the determination of the control parameters Cycles and Index of the Nout successive ramps of the waveform is performed by merger module 26 according to a method comprising five steps.

According to an embodiment, for each ramp in the batch of Nout successive ramps of the waveform being processed, the first step consists of calculating the exit hardware cycle of the ramp, that is, the last hardware cycle in which it is played, and deducing therefrom the number of cycles to be played since the last ramp. This corresponds to the quotient of the total duration Total by oversampling Nout minus the exit cycle of the previous ramp. There are two exceptions to be taken into account, resulting from the fact that a ramp aligned with the end of a hardware cycle has its last played cycle encroaching upon the next one. When the ramp ends up aligned with the end of a hardware cycle (that is, when data parameter Rest is equal to 0) while the last ramp was not, one hardware cycle to be played has to be removed. When the previous ramp has ended up aligned with a hardware cycle, while this one is not, it has to be played for one more cycle has.

According to an embodiment, at the first step, for each ramp of the Nout successive ramps of the waveform, merger module 26 thus determines the control parameter Cycles of the ramp as follows:
- in the case where the data parameter Rest of the ramp is equal to 0 and the data parameter Rest of the previous ramp is different from 0, the control parameter Cycles of the ramp is equal to the difference between the data item Total of the ramp and the data item Total of the previous ramp, decreased by 1;
- in the case where the data parameter Rest of the ramp is different from 0 and the data parameter Rest of the previous ramp is equal to 0, the control parameter Cycles of the ramp is equal to the difference between the data item Total of the ramp and the data item Total of the previous ramp, increased by 1; and
- in the case where the data parameter Rest of the ramp is equal to zero and the data parameter Rest of the previous ramp is equal to 0, or in the case where the data parameter Rest of the ramp is different from zero and the data parameter Rest of the previous ramp is different from zero, the control parameter Cycles of the ramp is equal to the difference between the data item Total of the ramp and the data item Total of the previous ramp.

During the processing of a batch of Nout ramps, merger module 26 stores in memory the data parameter Rest of the last ramp of the previous batch, to be able to determine the control parameter Cycles of the first ramp of the new processed batch. The first ramp of the waveform is processed like the others, however, during the processing of the first ramp, it is considered that there is a fictitious "previous" ramp having its data parameter Rest equal to 0.

In the case of the waveform shown in FIG. 6, merger module 26 provides, at the first step, the data gathered in Table 9 hereafter:

TABLE 9

| Ramps | Merger - Step 1<br>Cycles |
|---|---|
| R0 | 3 |
| R1 | 1 |
| R2 | 0 |
| R3 | 2 |

At a second step, merger module 26 determines a data item Block for each ramp in the batch of Nout ramps. For each ramp, if the control parameter Cycles of the ramp is equal to 0 and the data parameter Rest of the previous ramp is different from 0, the data item Block of the ramp is equal to 0, otherwise data item Block is equal to 1. For the processing the first ramp of the waveform, it is considered that there is a fictitious "previous" ramp having its data parameter Rest equal to 0 and its control parameter Cycles equal to 0. The second step thus comprises indicating the beginnings of groups of ramps. If the control parameter Cycles of the ramp is equal to 0, the ramp is not the beginning of a group of ramps, otherwise it is. There is one exception: if the previous ramp ends up aligned with the end of a hardware cycle, the next ramp is necessarily in a new group of ramps, even if the data item Cycles of the ramp is 0. In the case of the waveform shown in FIG. 6, merger module 26 determines at the second step the data gathered in Table 10 hereafter:

TABLE 10

| | Merger - Step 2 | |
|---|---|---|
| Ramps | Cycles | Block |
| R0 | 3 | 1 |
| R1 | 1 | 1 |
| R2 | 0 | 0 |
| R3 | 2 | 1 |

At a third step, merger module 26 determines, for each ramp in the batch of Nout ramps, a data item Blocksum which is equal to the sum of the data items Block of all the ramps in the batch of Nout ramps since the beginning in the batch including the considered ramp. In the case of the waveform shown in FIG. 6, merger module 26 determines at the third step the data gathered in Table 11 hereafter:

TABLE 11

| | Merger - Step 3 | | |
|---|---|---|---|
| Ramps | Cycles | Block | Blocksum |
| R0 | 3 | 1 | 1 |
| R1 | 1 | 1 | 2 |
| R2 | 0 | 0 | 2 |
| R3 | 2 | 1 | 3 |

At a fourth step, merger module 26 determines values of control parameter Index. For this purpose, an index is associated with each ramp of the Nout ramps processed by merger module 26, the first ramp of the Nout ramps having index 0 and the last ramp of the Nout ramps having index Nout-1. Each possible value of data item Blocksum is looked at. Data item Blocksum can vary between 1 and Nout. In the case where the data item Blocksum of no ramp in the batch of Nout ramps has the considered value, nothing is done. In the case where the data item Blocksum of a single ramp in the batch of Nout ramps has the considered data value Blocksum, control parameter Index, at the index equal to the considered data value Blocksum decreased by one unit, is equal to the index of the considered ramp. In the case where the data item Blocksum of at least two ramps has the considered data value Blocksum, control parameter Index, at the index equal to the considered data value Blocksum decreased by one unit, is equal to the lowest index of these ramps. The fourth step thus aims at determining the size of the ramp groups and their position in the set of Nout ramps processed by merger module 26. In the case of the waveform shown in FIG. 6, merger module 26 determines at the fourth step the data gathered in Table 12 hereafter. In this example, Nout being equal to 4, the possible values of data item Blocksum vary between 1 and 4. It is searched for value 4 in the Blocksum column: it is not there. It is then searched for value 3 in the Blocksum column, it is found for ramp R3. The control parameter Index at position 2 is thus equal to 3. It is then searched for value 2 in the Blocksum column, which is found for ramps R1 and R2, ramp R1 is thus retained. The control parameter Index at position 1 is thus equal to 1. It is then searched for value 1 in the Blocksum column, which is found for ramp R0. The control parameter Index at position 1 is thus equal to 0.

TABLE 12

| | Merger - Step 4 | | | |
|---|---|---|---|---|
| Ramps | Cycles | block | Blocksum | Index |
| R0 | 3 | 1 | 1 | 0 |
| R1 | 1 | 1 | 2 | 1 |
| R2 | 0 | 0 | 2 | 3 |
| R3 | 2 | 1 | 3 | 0 |

Merger module 26 determines, at a fifth step, the final version of the control parameters Cycles and Index in the batch of Nout ramps of the waveform for a storage in control memory 32. For each index of the control parameter Index obtained at the fourth step, the control parameter Cycles at the considered index is equal to the control parameter Cycles obtained at the fourth step, decreased by one unit, at the index equal to the control parameter Index obtained at the fourth step at the considered index. Further, the control parameter Index at the considered index is equal to the difference between the control parameter Index obtained at the fourth step, at the considered index increased by one unit, and the control parameter Index obtained at the fourth step at the considered index. The final versions of the control parameters Cycles and Index of the waveform shown in FIG. 6 are gathered together in Table 7 hereabove.

The execution of the waveform is performed by execution circuit 40. More specifically, interpretation module 42 reads the data parameters of the waveform from data memory 30, and fetch module 44 reads the control parameters from the waveform in control memory 32. At each hardware cycle, interpretation module 42 transmits to interpolation module 46 Nout sets of values, each set comprising a data item Value, a data item Dur, a data item Offset, and a data item Coeff.

At each hardware cycle, interpolation module 46 determines Nout digital values Point of digital signal Sn based on the Nout received data sets. Each digital value Point is obtained according to the following relation:

$$Point = Value + (Dur + Offset) * Coeff \quad \text{[Math 1]}$$

Interpolation module 46 comprises Nout parallel interpolation submodules, each interpolation submodule being configured to calculate one of the Nout digital values Point of digital signal Sn based on one of the sets of values comprising a data item Value, a data item Dur, a data item Offset, and a data item Coeff.

The execution of the waveform shown in FIG. 6 will now be described. During the execution of this waveform by execution circuit 40, interpretation module 42 continuously reads from data memory 30 the data parameters of Nout successive ramps of the waveform. In the case of the waveform shown in FIG. 6, execution circuit 40 thus reads the data parameters of Table 6. At the first hardware cycle, execution circuit 40 processes the data parameters of the first ramp, which are stored in a data register shown in Table 13 hereafter.

TABLE 13

| Data register - Cycle 1 | | | |
|---|---|---|---|
| Value | Coeff | Offset | Rest |
| 0 | 381.09 | 0 | 3 |

The data parameters of the next Nout ramps are read from a reading window shown in Table 14 hereafter.

TABLE 14

| Reading window - Cycle 1 | | |
|---|---|---|
| Start_val | Coeff | Rest |
| 4,192 | −1,451 | 1 |
| 1,290 | 1,612 | 2 |
| 2,902 | −414.57 | 1 |
| x | x | x |

The control parameters of the waveform of FIG. 6 read by fetch module 44 are indicated in Table 15 hereafter. At the first hardware cycle, fetch module 44 stores in memory a data item Current_cycle equal to the value of control parameter Cycles of the first row of Table 7, and a data item Current_Index equal to the value of control parameter Index of the first row of Table 7.

TABLE 15

| Fetch module - Cycle 1 | |
|---|---|
| Current_cycle | Current_Index |
| 2 | 1 |

Since Nout is equal to 4, interpretation module 42 supplies interpolation module 46 with four sets of values, each comprising data item Value equal to 0, data item Coeff equal to 381.09, data item Offset equal to 0, and data item Dur respectively equal to 0, Tdac, 2*Tdac, and 3*Tdac.

In the second hardware cycle, interpretation module 42 adds value Nout*Coeff to the data item Value used in the first hardware cycle. This does not require performing a multiplication since Nout is a power of two. Interpretation module 42 thus updates data item Value as shown in Table 16 hereafter. The window for the reading of Nout successive ramps by interpretation module 42 does not move and is shown in Table 17 hereafter. Further, fetch module 44 updates control parameter Current_cycle as shown in Table 18 hereafter.

TABLE 16

| Data register - Cycle 2 | | | |
|---|---|---|---|
| Value | Coeff | Offset | Rest |
| 1,524.36 | 381.09 | 0 | 3 |

TABLE 17

| Reading window - Cycle 2 | | |
|---|---|---|
| Start_val | Coeff | Rest |
| 4,192 | −1,451 | 1 |
| 1,290 | 1,612 | 2 |
| 2,902 | −414.57 | 1 |
| x | x | x |

TABLE 18

| Fetch module - Cycle 2 | |
|---|---|
| Current_cycle | Current_Index |
| 1 | 1 |

Interpretation module 42 supplies interpolation module 46 with four sets of values, each comprising data item Value equal to 1,524.36, data item Coeff equal to 381.09, data item Offset equal to 0, and data item Dur respectively equal to 0, Tdac, 2*Tadc, and 3*Tdac.

In the third hardware cycle, interpretation module 42 adds value Nout*Coeff to the data item Value used in the second hardware cycle. Interpretation module 42 thus updates data item Value as shown in Table 19 hereafter. The window for the reading of Nout successive ramps by interpretation module 42 remains unchanged and is shown in Table 20 hereafter. Further, fetch module 44 updates data item Current_cycle, as shown in Table 21 hereafter.

TABLE 19

| Data register - Cycle 3 | | | |
|---|---|---|---|
| Value | Coeff | Offset | Rest |
| 3,048.72 | 381.09 | 0 | 3 |

TABLE 20

| Reading window - Cycle 3 | | |
|---|---|---|
| Start_val | Coeff | Rest |
| 4,192 | −1,451 | 1 |
| 1,290 | 1,612 | 2 |
| 2,902 | −414.57 | 1 |
| x | x | x |

TABLE 21

| Fetch module - Cycle 3 | |
|---|---|
| Current_cycle | Current_Index |
| 0 | 1 |

Since the current data item Cycles is equal to 0 and the data item Rest is equal to 3, interpretation module 42 supplies interpolation module 46 with four sets of values, including three sets of values, each comprising data item Value equal to 3,048.72, data item Coeff equal to 381.09, data item Offset equal to 0, and data item Dur respectively equal to 0, Tdac, and 2*Tdac, and a fourth set of values comprising data item Value equal to 4,192, data item Coeff equal to −1,451, data item Offset equal to 0, and data item Dur equal to 0. The fourth set of values is determined with the data present in the first row of Table 20, designated by the value of the current index Index in Table 21.

At the fourth hardware cycle, interpretation module 42 updates data item Value, data item Coeff, data item Offset, and data item Rest as shown in Table 22 hereafter. The window for the reading of Nout successive ramps by interpretation module 42 is offset, as shown in Table 23 hereafter. Further, fetch module 44 updates data Current_cycle and Current_Index as shown in Table 24 hereafter, data item Current_cycle being equal to the value of the control parameter Cycles in the second row of Table 7 and data item Current_Index being equal to the value of the control parameter Index in the second row of Table 7.

TABLE 22

| Data register - Cycle 4 | | | |
|---|---|---|---|
| Value | Coeff | Offset | Rest |
| 4,192 | 381.09 | 1 | 1 |

TABLE 23

| Reading window - Cycle 4 | | |
|---|---|---|
| Start_val | Coeff | Rest |
| 1,290 | 1,612 | 2 |
| 2,902 | −414.57 | 1 |
| x | x | x |
| x | x | x |

TABLE 24

| Fetch module - Cycle 4 | |
|---|---|
| Current_cycle | Current_index |
| 0 | 2 |

Since the current data item Cycles is equal to 0, data item Offset is equal to 1, and data item Rest is equal to 1, interpretation module 42 supplies interpolation module 46 with a set of values comprising data item Value equal to 4,192, data item Coeff equal to −1,451, data item Offset equal to 1, and data item Dur equal to 0, after which interpretation module 42 supplies interpolation module 46 with a set of values comprising data item Value equal to 1,290, data item Coeff equal to 1,612, data item Offset equal to 0, and data item Dur equal to 0, and finally two sets of values, each comprising data item Value equal to 2,902, data item Coeff equal to −414.57, data item Offset equal to 0, and data item Dur respectively equal to 0 and Tdac.

At the fifth hardware cycle, interpretation module 42 updates data item Value, data item Coeff, data item Offset, and data item Rest as indicated in Table 25 hereafter. The window for the reading of Nout successive ramps by interpretation module 42 is offset, as shown in Table 26 hereafter. Further, fetch module 44 updates data Current_cycle and Current_index as indicated in Table 27 hereafter, data item Current_cycle being equal to the value of the control parameter Cycles in the third row of Table 7 and data item Current_Index being equal to the value of the control parameter Index in the third row of Table 7.

TABLE 25

| Data register - Cycle 5 | | | |
|---|---|---|---|
| Value | Coeff | Offset | Rest |
| 2,902 | −414.57 | 2 | 1 |

TABLE 26

| Reading window - Cycle 5 | | |
|---|---|---|
| Start_val | Coeff | Rest |
| x | x | x |
| x | x | x |
| x | x | x |
| x | x | x |

TABLE 27

| Fetch module - Cycle 5 | |
|---|---|
| Current_cycle | Current_index |
| 1 | x |

Since the current data item Cycles is equal to 1, data item Offset is equal to 2, and data item Rest is equal to 1, interpretation module 42 supplies interpolation module 46 with four sets of values, each comprising data item Value equal to 2,902, data item Coeff equal to −414.57, data item Offset equal to 2, and data item Dur respectively equal to 0, Tdac, 2*Tdac, and 3*Tdac.

In the sixth hardware cycle, interpretation module 42 adds value Nout*Coeff to the data item Value used in the fifth hardware cycle. Interpretation module 42 thus updates data item Value as shown in Table 28 hereafter. The window for the reading of Nout successive ramps by interpretation module 42 remains unchanged and is shown in Table 29 hereafter. Further, fetch module 44 updates data item Current_cycle, as shown in Table 29 hereafter.

TABLE 28

| Data register - Cycle 6 | | | |
|---|---|---|---|
| Value | Coeff | Offset | Rest |
| 1,243.72 | −414.57 | 2 | 1 |

TABLE 29

| Reading window - Cycle 6 | | |
| --- | --- | --- |
| Start_val | Coeff | Rest |
| x | x | x |
| x | x | x |
| x | x | x |
| x | x | x |

TABLE 30

| Fetch module - Cycle 6 | |
| --- | --- |
| Current_cycle | Current_index |
| 0 | x |

Since the current data item Cycles is equal to 0, data item Offset is equal to 2, and data item Rest is equal to 1, interpretation module 42 supplies interpolation module 46 with two sets of values, each comprising data item Value equal to 1,243.72, data item Coeff equal to −414.57, data item Offset equal to 2, and data item Dur respectively equal to 0 and Tdac. To complete the final hardware cycle, interpretation module 42 can supply interpolation module 46 with two sets of values, each comprising data item Value equal to 1,243.72, data value Coeff equal to 0, data value Offset equal to 0, and data value Dur respectively equal to 2*Tdac and 3*Tdac. As a variant, to complete the final hardware cycle, interpretation module 42 may supply interpolation module 46 with two sets of values corresponding to determined points.

Figure 10:
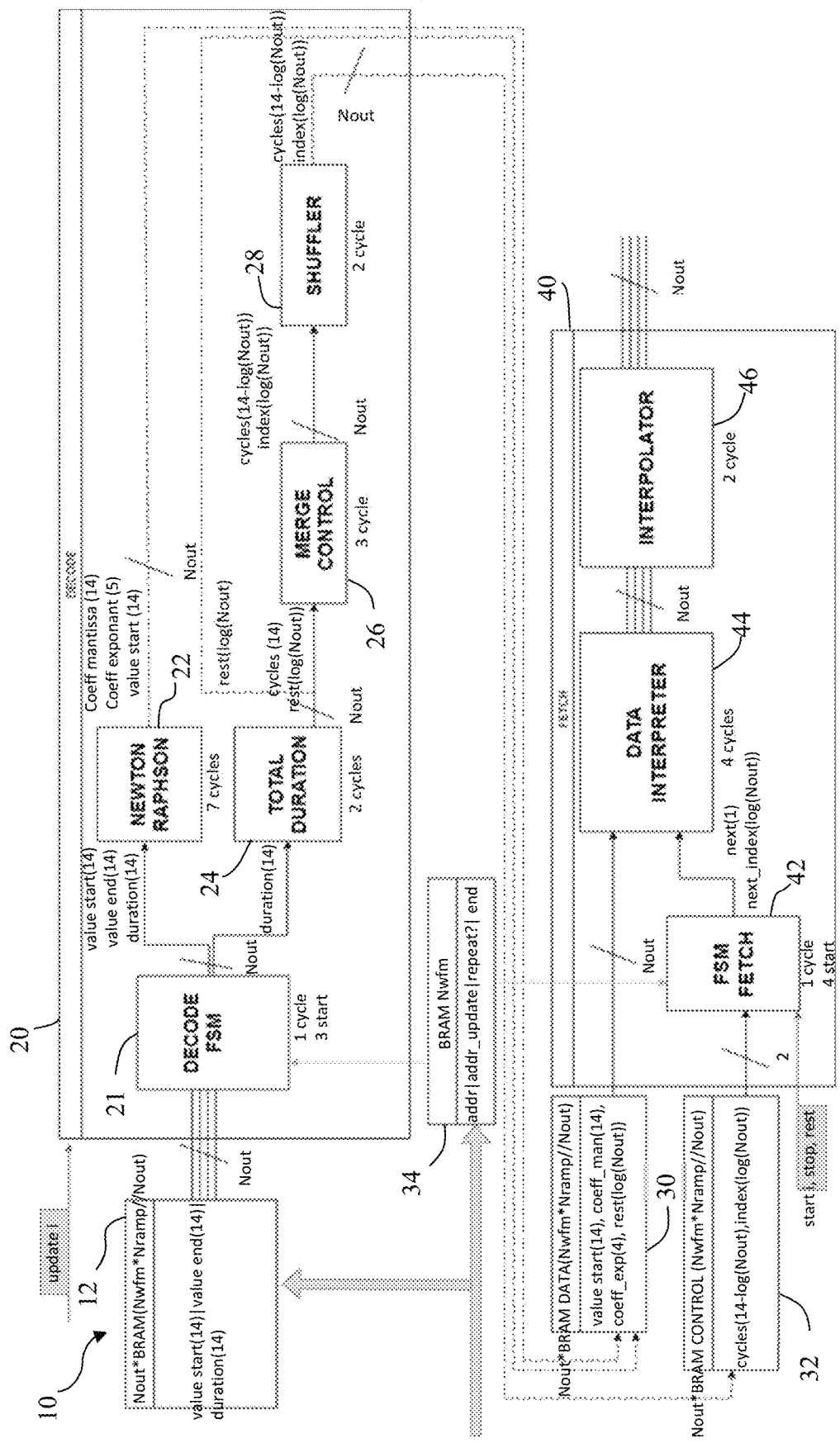
FIG. 10 shows a more detailed embodiment of the electronic circuit of FIG. 9.

FIG. 10 shows a more detailed version of the electronic circuit 10 of FIG. 9.

The decoder circuit 20 configured to provide the data parameters and the control parameters of the waveform based on the raw parameters comprises a finite state machine 21 configured to read, at each hardware cycle, Nout data sets from the memory 12 in which the raw parameters of the waveform are stored. Finite state machine 21 is configured to distribute the Nout data sets to dividing module 22 and to duration calculation module 24.

Dividing module 22 is adapted to implementing a division algorithm of Newton Raphson type. Dividing module 22 receives the start value Start_val, the end value End_val, and the duration Duration of each ramp. Dividing module 22 supplies Nout data parameters Start_val and Nout data parameters Coeff for each hardware cycle. According to an embodiment, dividing module 22 requires two hardware cycles to perform a division.

The fetch module 44 of execution circuit 40, configured to determine the digital values of the waveform based on the data parameters and on the control parameters, corresponds to a finite state machine 44 configured to read, at each hardware cycle, the data parameters and the control parameters of Nout successive ramps from memories 30 and 32.

According to an embodiment, the raw parameters of the waveform, that is, data Start_val, End_val, and Duration for each ramp are each stored over a number NB of bits in memory 12. According to an embodiment, for each ramp of the waveform, data parameter Start_val is stored over the number NB of bits in data memory 30, data parameter Coeff is stored as a float over the number NB of mantissa bits and 4 exponent bits in data memory 30 and data parameter Rest is stored over log(Nout) bits (in base 2) in data memory 30. According to an embodiment, control parameter Cycles is stored over NB-log(Nout) bits in control memory 32 and control parameter Index is stored over log(Nout) bits (in base 2) in control memory 32. As an example, the number NB of bits is equal to 14.

According to an embodiment, memory 12 comprises Nout memory blocks BRAM in parallel. According to an embodiment, memory 30 comprises Nout memory blocks BRAM DATA in parallel. According to an embodiment, memory 32 comprises Nout memory blocks BRAM CONTROL in parallel. According to an embodiment, the size of memory 30 is the same as the size of memory 32. According to an embodiment, memory 34 comprises Nwfm memory blocks BRAM.

Figure 11:
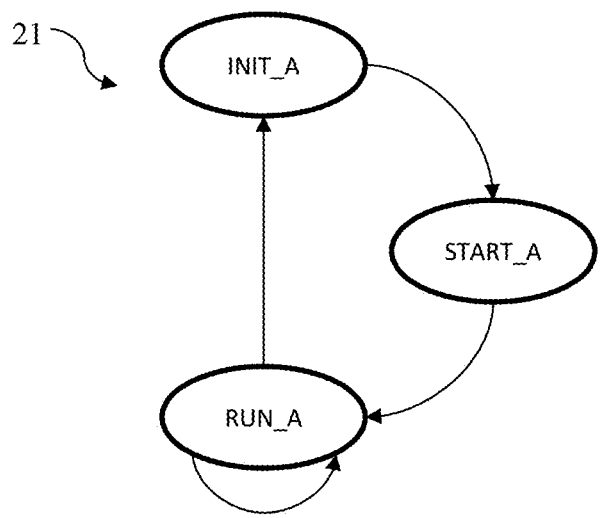
FIG. 11 illustrates an embodiment of a finite state machine of the electronic circuit of FIG. 10.

FIG. 11 illustrates an example of embodiment of a finite state machine 21. The role of the finite state machine is to read the raw parameters, that is, raw parameters Start_val, End_val, and Duration, from memory 12, and to transmit them to dividing module 22 and to duration calculation module 24.

Finite state machine 21 comprises three states: INIT_A, START_A, and RUN_A. In state INIT_A, finite state machine 21 is idle. The transition from state INI_A to state START_A is achieved when a bit called update is set to logic value "1" by a system external to electronic circuit 10. This means that the determination of the data parameters and of the control parameters of a new waveform is to be performed by decoding circuit 20 based on the raw parameters of this new waveform, which are stored in memory 12. The external system further sends to electronic circuit 10 an identifier of the waveform to be executed. At state START_A, finite state machine 21 reads, from memory 34, based on the identifier of the waveform, the read address of memory 12 at which the reading of the raw parameters of the waveform will start, the address of data memory 30 at which the writing of the data parameters into data memory 30 will start, and the address of control memory 32 at which the writing of the control parameters into control memory 32 will start. Advantageously, the address of data memory 30 at which the writing of the data parameters will start is the same as the address of control memory 32 at which the writing of control parameters will start. Finite state machine 21 then sets a bit end_param to logic value "1", which causes the transition from state START_A to state RUN_A. At state RUN_A, finite state machine 21 will read, from memory 12, the raw parameters, that is, raw parameters Start_val, End_val, and Duration, of Nout successive ramps of the waveform, and supplies, at each hardware cycle, the raw parameters Start_val, End_val, and Duration of Nout successive ramps to dividing module 22 and the raw parameters Duration of these Nout successive ramps to duration calculation module 24. When finite state machine 21 has transmitted the raw parameters of the last Nout successive ramps of the waveform to dividing module 22 and to duration calculation module 24, it sets a bit end_update to logic value "1", which causes the transition from state RUN_A to state INIT_A.

Figure 12:
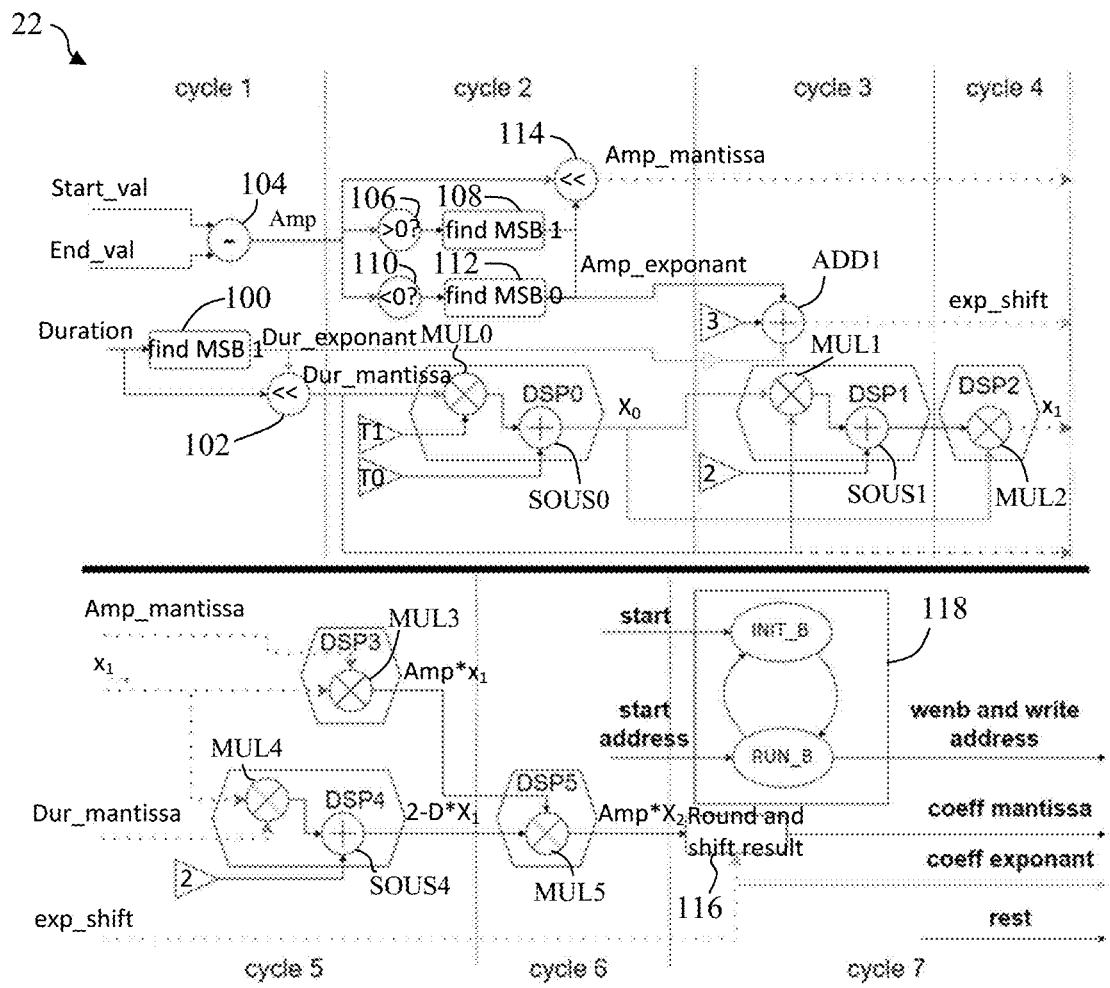
FIG. 12 shows an embodiment of a dividing module of the electronic circuit of FIG. 10.

FIG. 12 shows an embodiment of dividing module 22.

Dividing module 22 receives the raw parameters Start_val, End_val, and Duration supplied by finite state machine 21. For each ramp, the determination of data parameter Coeff requires the determination of the inverse of the duration Duration of the ramp. For this purpose, dividing module 22 implements an iterative algorithm according to the following relation:

$$X_{i+1} = X_i(2 - \text{Duration} * X_i) \quad [\text{Math 2}]$$

where $X_i$ is an estimate of 1/Duration

The error $\varepsilon_i$ between the estimate and 1/Duration is provided by the following relation:

$$\varepsilon_{i+1} = 1 - \text{Duration} * X_{i+1} = \varepsilon_i^2 \quad [\text{Math 3}]$$

To initialize the algorithm, $X_0$ is provided by the following relation:

$$X_0 = T0 - T1 * \text{Duration} \quad [\text{Math 4}]$$

where T0 is equal to 42/17 and T1 is equal to 32/17.

According to an embodiment, dividing module 22 performs two iterations of this algorithm with a 15-bit accuracy. Only two loops are sufficient with a rounding over 14 bits to ensure a bit-accuracy and thus an error accumulation over the maximum duration of less than 2 bits.

Dividing module 22 comprises a module 100 which receives raw parameter Duration and provides the most significant bit Dur_exponent of raw parameter Duration. Dividing module 22 comprises a module 102 which receives raw parameter Duration and provides a signal Dur_mantissa equal to the raw parameter Duration with its bits shifted by one position towards the most significant bit and which thus corresponds to the mantissa of raw parameter Duration. Signal Dur_mantissa is thus normalized between 0.5 and 1.

Dividing module 22 comprises a block DSP0 achieving the initialization of the algorithm by implementing relation Math 4 and comprising a multiplier MUL0 receiving signal Dur_mantissa and signal T1 and supplying the product of signal Dur_mantissa and of signal T1 and comprising a subtractor SOUS0 receiving the signal supplied by multiplier MUL0 and signal T1 and supplying signal $X_0$.

Dividing module 22 comprises blocks DSP1 and DSP2 implementing a first iteration according to relation Math 2. Block DSP1 comprises a multiplier MUL1 receiving signal $X_0$ and signal Dur_mantissa and supplying the product of signal $X_0$ and of signal Dur_mantissa and comprising a subtractor SOUS1 receiving the signal provided by multiplier MUL1 and digit 2 and supplying the difference between digit 2 and the signal supplied by multiplier MUL1. Block DSP2 comprises a multiplier MUL2 receiving the signal supplied by subtractor SOUS1 and signal $X_0$ and supplying signal $X_1$.

Dividing module 22 comprises blocks DSP3, DSP4, and DSP5 implementing a second iteration according to relation Math 2. Block DSP3 comprises a multiplier MUL3 receiving signal Amp_mantissa and signal $X_1$ and supplying a signal Amp*$X_1$ equal to the product of signal Amp_mantissa and of signal $X_1$. Block DSP4 comprises a multiplier MUL4 receiving signal $X_1$ and signal Dur_mantissa and supplying the product of signal $X_1$ and of signal Dur_mantissa and comprising a subtractor SOUS4 receiving the signal supplied by multiplier MUL4 and digit 2 and supplying the difference between digit 2 and the signal supplied by multiplier MULA. Block DSP5 comprises a multiplier MUL5 receiving signal Amp*$X_1$ and the signal supplied by subtractor SOUS4 and supplying signal Amp*$X_2$ equal to the product of signal $X_2$ and of signal Amp_mantissa.

Dividing module 22 comprises a subtractor 104 which receives raw parameter Start_val and raw parameter End_val and which determines a data item Amp equal to the difference between raw parameter End_val and raw parameter Start_val. Dividing module 22 comprises a module 106 which determines whether data item Amplitude is positive and a module 108 which then provides the most significant bit Amp_exponent of data item Amplitude, and a module 110 which determines whether data item Amplitude is negative and a module 112 which then provides the most significant bit Amp_exponent of data item Amplitude. Dividing module 22 comprises a module 114 which receives data item Amplitude and supplies a signal Amp_mantissa equal to the data item Amplitude with its bits shifted by a number of positions equal to 13-Amp-exponent towards the most significant bit. Signal Amp_mantissa thus corresponds to the mantissa of data item Amplitude. Signal Amp_mantissa is thus normalized between 0.5 and 1.

Dividing module 22 comprises an adder ADD1 which receives signal Amp_exponent, digit 3, and signal Dur_exponent and supplies a signal Coeff_exponent equal to the sum of signal Amp_exponent and of digit 3, decreased by signal Dur_exponent.

Dividing module 22 comprises a module 116 which receives signal Amp*$X_2$ and signal Coeff_exponent and supplies a signal Coeff_mantissa.

Dividing module 22 comprises a finite state machine 118. The role of finite state machine 118 is to supply the write addresses of the data memory 30 for the writing of data parameters Coeff_mantissa, Coeff_exponant, Start_val, and Rest into data memory 30, data parameters Rest being supplied by duration calculation module 24. Finite state machine 118 has two states, INIT_B and RUN_B. At state INIT_B, finite state machine 118 is idle. The transition from state INI_B to state START_B is performed when finite state machine 21 sets a bit start_B to logic value "1". At state RUN_B, state machine 118 receives the address start_address of data memory 30 at which the writing of data parameters Coeff_mantissa, Coeff_exponent, and Start_val into data memory 30 is to begin, and determines the successive write addresses of data memory 30 at which data parameters Coeff_mantissa, Coeff_exponent, Start_val, and Rest are written into data memory 30 as they are being supplied. The transition from state RUN_B to state INI_B is performed when finite state machine 21 sets bit start_B to logic value "0".

Figure 13:
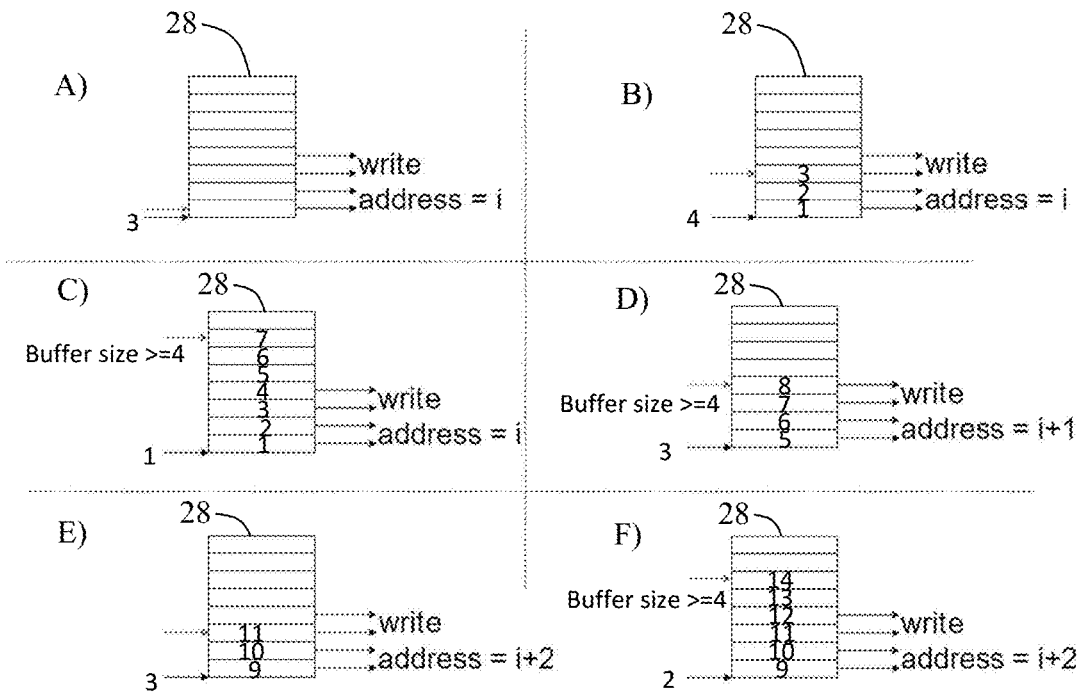
FIG. 13 illustrates an embodiment of a method of managing a memory of the electronic circuit of FIG. 10.

FIG. 13 illustrates an embodiment of a method of operation of shuffler module 28. The operation of shuffler module 28 requires two hardware cycles. Shuffler module 28 receives control parameters Cycles and Index from merger module 26 and stores them in a temporary memory operating according to the first-in, first-out method. At each hardware cycle, shuffler module 28 writes into control memory 32 the first four entries in the temporary memory. When the number of data stored in the memory of shuffler module 28 exceeds a threshold Buffer size, then the number Buffer size of data empties the first four entries of the temporary memory and shifts by four positions the other entries of the temporary memory, and the write address of memory 32 is incremented. As an example, threshold Buffer size is equal to 4. As an example, at step A), shuffler module 28 receives three new data items. The three new data items 1, 2, and 3 are shown as stored in memory at step B). Shuffler module 28 performs an operation of writing of data items 1, 2, and 3 into control memory 32 with a write address equal to i. Further, at step B), shuffler module 28 receives four new data items. The four new data items 4, 5, 6 and 7 are shown as stored in memory at step C). Shuffler module 28 performs an operation of writing of data items 1, 2, 3, and 4 into control memory 32 with the write address equal to i. Since the number of stored data items is greater than 4 at step C), shuffler module 28 deletes data items 1, 2, 3, and 4 as shown at step D) and shifts data items 5, 6, 7 by four positions and the write address is incremented by one. Further, at step C), shuffler module 28 receives a new data item. The new data item 8 is shown as stored in memory at step D). Shuffler module 28 performs an operation of writing of data items 5, 6, 7, and 8 into control memory 32 with the write address equal to i+1. Since the number of stored data items is greater than 4 at step D), shuffler module 28 deletes data items 5, 6, 7, and 8 from control memory 32 as shown at step E). Further, at step D), shuffler module 28 receives three new data items. The three new data items 9, 10, and 11 are shown as stored in memory at step E). Shuffler module 28 performs an operation of writing of data items 9, 10, and 11 into control memory 32 with the write address equal to i+2. Further, at step E), shuffler module 28 receives three new data items. The three new data items 12, 13, and 14 are shown as stored in memory at step F). Shuffler module 28 performs an operation of writing of data items 9, 10, 11, and 12 into control memory 32 with the write address equal to i+2.

Figure 14:
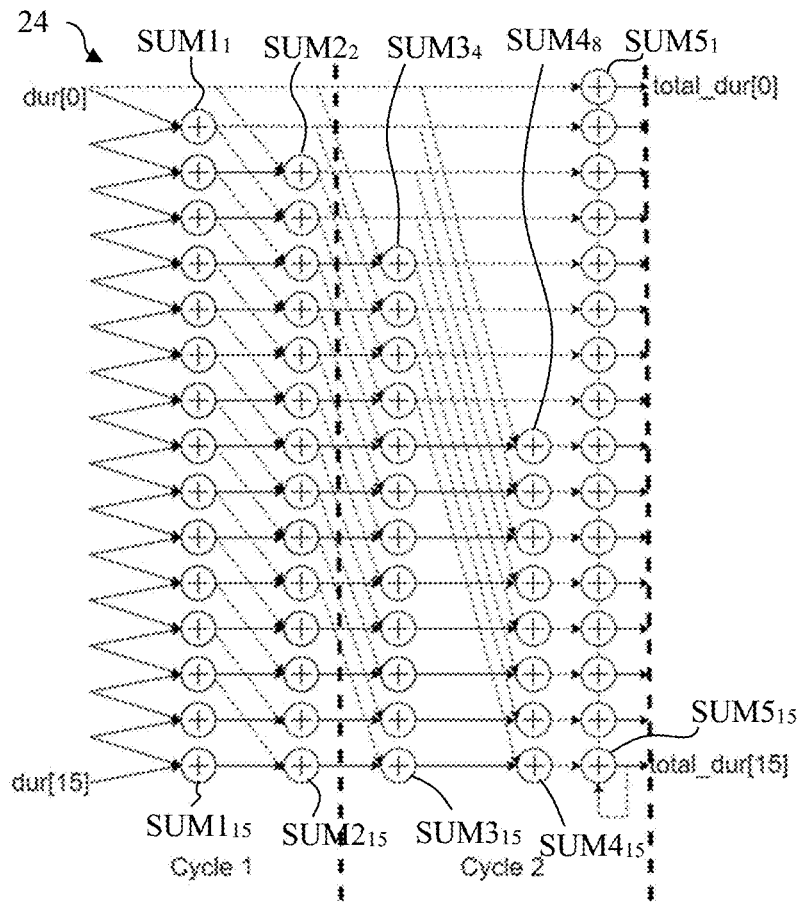
FIG. 14 shows an embodiment of a time calculation module of the electronic circuit of FIG. 10.

FIG. 14 shows an embodiment of duration calculation module 24 configured to determine the total duration total_dur of the waveform. According to an embodiment, duration calculation module 24 has a Kogge-Stone structure. According to an embodiment, duration calculation module 24 receives Nout raw parameters Duration, noted in FIG. 14 dur[0] to dur[Nout], of Nout successive ramps and determines Nout duration data items Total_dur[0] to total_dur[Nout-1]. According to an embodiment, each raw parameter dur[0] to dur[Nout] comprises 14 bits and each data item Total_dur[0] to total_dur[Nout-1] comprises 14+log(Nout) bits. As an example, in FIG. 14, Nout is equal to 16.

Duration calculation module 24 receives the raw data Duration of the ramps coded over 14 bits, dur[0] to dur[15]. Duration calculation module 24 comprises first adders SUM1, j being an integer varying from 1 to 15. Each adder SUM1$j$, $j$ varying from 1 to 15, receives data items dur[j−1] and dur[j] and determines data item s1[$j$], equal to the sum of data items dur[j−1] and dur[j]. Duration calculation module 24 also comprises second adders SUM2$j$, $j$ being an integer varying from 2 to 15. Each adder SUM2$j$, $j$ varying from 2 to 15, receives data items s1[$j$−2] and s1[$j$], data item s1[0] being equal to data item dur[0]. Each adder SUM2$j$, $j$ varying from 2 to 15, determines data item s2[$j$] equal to the sum of data items s1[$j$−2] and s1[$j$] and thus equal to the sum of data items dur[j−2] to dur[j]. Duration calculation module 24 also comprises third adders SUM3$j$, $j$ being an integer varying from 4 to 15. Each adder SUM3$j$, $j$ varying from 4 to 15, receives data items s2[$j$−4] and s2[$j$], bit s2[0] being equal to dur[0] and bit s2[1] being equal to bit s1[1]. Each adder SUM3$j$, $j$ varying from 4 to 15, determines the data item s3[$j$] equal to the sum of data items s2[$j$−4] and s2[$j$] and thus equal to the sum of data items dur[j−5] to dur[j].

Duration calculation module 24 further comprises fourth adders SUM4$j$, $j$ being an integer varying from 8 to 15. Each adder SUM4$j$, $j$ varying from 8 to 15, receives data items s3[$j$−8] and s3[$j$], bit s3[0] being equal to dur[0], bit s3[1] being equal to bit s1[1], bit s3[2] being equal to bit s2[2], and bit s3[3] being equal to bit s2[3]. Each adder SUM4$j$, $j$ varying from 8 to 15, determines the data item s4[$j$] equal to the sum of data items s3[$j$−8] and s3[$j$] and thus equal to the sum of data items dur[j−8] to dur[j]. Duration calculation module 24 further comprises fifth adders SUM5$j$, $j$ being an integer varying from 0 to 15. Each adder SUM5$j$, $j$ varying from 1 to 15, determines the data item Total_dur[j] equal to the sum of bit s4[$j$] and of the previous value of total_dur[j].

Figure 15:
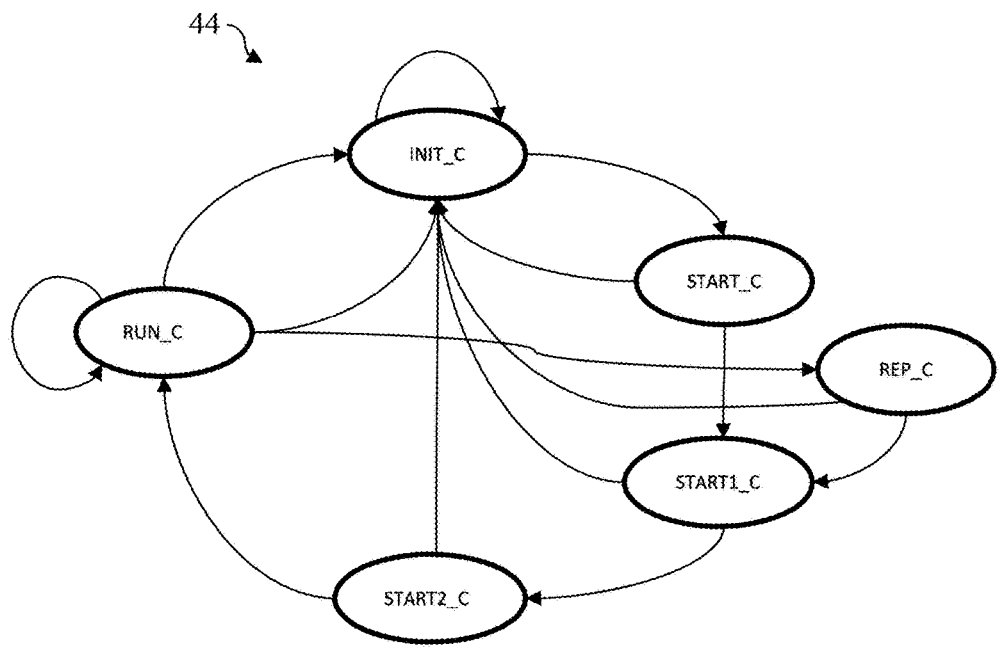
FIG. 15 illustrates an embodiment of another finite state machine of the electronic circuit of FIG. 10.

FIG. 15 illustrates an example of fetch module 44 when it corresponds to a finite state machine. Fetch module 44 receives instructions from the user, such as to start or stop the execution of a waveform. Fetch module 44 has the role, during the execution of a waveform, of determining the read addresses of data memory 30 in which the data parameters are stored, and the read addresses of control memory 32 in which the control parameters are stored.

Fetch module 44 has six states: INIT_C, START_C, START1_C, START2_C, RUN_C, and REP_C.

At state INIT_C, fetch module 44 is idle. The transition from state INI_C to state START_C is performed when a bit called update is set to logic value "1" by a system external to electronic circuit 10. This corresponds to an instruction to start the execution of a waveform. The starting of the waveform costs 4 hardware cycles.

At state START_C, fetch module 44 reads execution parameters of the waveform from memory 34, including in particular the size (parameter Taille_waveform) of the waveform and whether or not the waveform is to be executed repeatedly (Repeat parameter). Fetch module 44 further reads, from memory 34, the read address of data memory 30 at which to start the reading of the data parameters of the waveform. Fetch module 44 then sets a bit called started to logic value "1", which causes the transition from state START_C to state START1_C.

At state START1_C, fetch module 44 performs a reading of the data parameters of the waveform, from data memory 30, at the read address obtained at state START_C, and a reading of the control parameters of the waveform, from control memory 32, at the read address obtained at state START_C. Fetch module 44 then sets a bit end_data to logic value "1", which causes the transition from state START1_C to state START2_C.

At state START2_C, fetch module 44 waits until the read step initiated at state START1_C has been successfully completed. The transition from state START_2_C to state RUN_C is performed when a bit first_next is set to logic value "1" by fetch module 33.

At state RUN_C, fetch module 44 determines the next read addresses read_data_addresses of the data parameters in data memory 30 and the next read addresses wr_addr of the control parameters in control memory 32. Fetch module 44 may further provide a data item shift_data and a data item next_index used by interpretation module 42, as described hereafter.

The transition from state RUN_C to state REP_C is performed when fetch module 44 has read the latest data parameters and control parameters of the waveform and the waveform is to be executed repeatedly. The transition from state RUN_C to state INIT_C is performed when fetch module 44 has read the last data parameters and control parameters of the waveform and the waveform is to be executed once only.

At state REP_C, fetch module 44 resets the execution of the waveform. Fetch module 44 then transits to state START1_C, in the same way as at the first execution of the waveform.

The transition from state START_C, START1_C, START2_C, RUN_C, and REP_C to state INIT_C is performed when a bit called stop is set to logic value "1" by a system external to electronic circuit 10. This corresponds to an instruction to stop the execution of a waveform.

Figure 16:
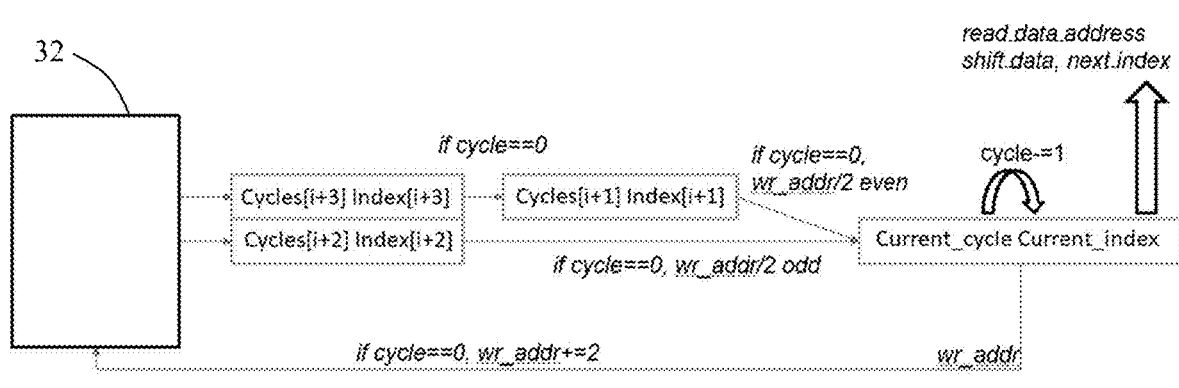
FIG. 16 illustrates an embodiment of a method of operation of the finite state machine of FIG. 15.

FIG. 16 illustrates an embodiment of a method of reading of the control parameters from control memory 32 by fetch module 44 at state RUN_C.

Fetch module 44 must be capable of analyzing and of reading one line of control parameters from control memory 32 per hardware cycle. Indeed, a group of ramps may last for one hardware cycle only. It is therefore necessary to be able to determine the next read address in data memory 30 within one hardware cycle in order to deal with the case where a plurality of groups of this type follow one another. According to an embodiment, the changing of a read address and the recovery of the data may cost more than one hardware cycle, for example two hardware cycles. Thus, fetch module 44 must be able to have access "in advance" to the information of the next control line. According to an embodiment, fetch module 44 reads the lines two by two from control memory 32 and stores, in a buffer memory, the odd lines (Cycles[i+1] Index[i+1]). The read address wr_addr in control memory 32 is thus incremented two by two. Generally, depending on the latency of fetch module 44, a reading of more than two lines of control memory 32 may be provided.

When the group of ramps ends (which corresponds to data item Current_cycle equal to 0), fetch module 44 updates read addresses read_data_address, sends to interpretation module 42 the next realignment shift, shift_data, as well as the size of the ramp group next_index to manage the transition to the next ramp group.

As an example, fetch module 44 sets data item Current_cycle to be equal to control parameter Cycles[i] and sets data item Current_Index to be equal to the control parameter Index[i] read at address wr_addr of memory 32, and keeps in memory the control parameters Cycles[i+1], Index[i+1] read at address wr_addr+1 of memory 32. At each hardware cycle, data item Current_cycle is decreased by 1 (cycle-=1). When the value of data item Current_cycle is equal to 0 (if cycle==0) and the control parameters Cycles[i+1] Index[i+1] have not been used yet (wr_addr/2 even), fetch module 44 sets data item Current_cycle to be equal to control parameter Cycles[i+1] and sets data item Current_Index to be equal to the control parameter Index[i+1] read from address wr_addr+1 of memory 32. When the value of data item Current_cycle is equal to 0 (if cycle==0) and the control parameters Cycles[i+1] Index[i+1] have already been used (wr_addr/2 odd), the read address wr_addr in control memory 32 is incremented by 2 (wr_addr+=2), and the next two lines (Cycles[i+2] Index[i+2] and Cycles[i+3] Index[i+3]) are read from memory 32.

Figure 17:
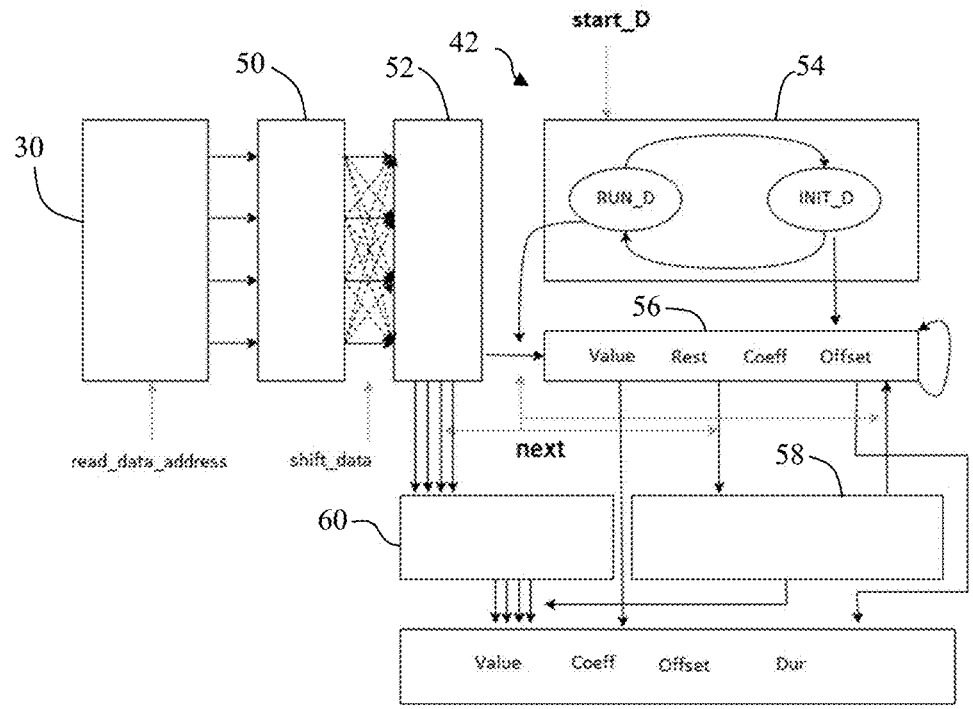
FIG. 17 shows an embodiment of an interpretation module of the electronic circuit of FIG. 10.

FIG. 17 shows an embodiment of interpretation module 42.

Interpretation module 42 comprises:
a first buffer memory 50;
a second buffer memory 52;
a finite state machine 54;
a processing memory 56;
an index register 58; and
an output memory 60.

Finite state machine 54 comprises two states RUN_D and INIT_D. At state INIT_D, finite state machine 54 provides default values for data items Value, Rest, Coeff, and Offset. The transition from state INI_D to state RUN_D is performed when finite state machine 44 sets a bit start_D to logic value "1". At state RUN_D, finite state machine 54 determines Nout points at each hardware cycle. The transition from state RUN_D to state INIT_D is performed when finite state machine 44 sets bit start_D to logic value "0".

Data memory 30 is implemented like Nout memory blocks in parallel, whereby, since the reading is performed with a sliding window which is not aligned with Nout, the data have to be realigned. Fetch module 44 determines the value of the shift shift_data required for the realignment, described in more detail hereafter.

On reading of a new ramp at the beginning of a new hardware cycle, finite state machine 54 reads the data items Start_val, Coeff, and Rest stored in second buffer memory 52 and stores them in processing memory 56. The data item Start_val over 14 bits of second buffer memory 52 is stored over 28 bits in processing memory 56 in data item Value. The data parameter Coeff over 14 bits of second buffer memory 52 is stored over 28 bits with a fixed point in processing memory 56. The Nout lines of first buffer memory 50 and of second buffer memory 52 are then updated.

At each hardware cycle, finite state machine 54 determines Nout points which are stored in output memory 60. Each point corresponds to a set of data comprising data item Value, data parameter Coeff, data item Dur, and data item Offset. The Nout points stored in output memory 60 are read by interpolation module 44 to provide Nout digital values of digital signal Sn, according to the above-described relation Math 1. Data item Dur corresponds to the duration relative to the time of value Value, and may thus vary from 0 to (Nout-1)*Tdac. Data item Offset corresponds to a time offset and is equal to a multiple of Tdac (possibly 0).

When the hardware cycle is finished but the ramp has not been completed, value Value is updated by adding thereto data item Nout*Coeff. To avoid having to perform a multiplication, this can be done by shifting the bits of data item Coeff leftwards Nout times and by adding the resulting value to data item Value. Finite state machine 54 will perform this action as long as the first ramp of the group has not been exhausted.

When the first ramp has been exhausted, the system will start filling the Nout points with the number Rest of points of the first ramp. Knowing the size of the ramp group, it will fetch the ramps necessary to complete the cycle. Each ramp has its duration encoded in data item Rest. Thus, interpretation module 42 will concatenate the Nout points necessary to complete the hardware cycle. It can then fetch the first ramp of the next group of ramps, and calculate value Offset (part of the ramp played during the previous group). This value Offset avoids an additional multiplication to initialize the value of the first ramp of the next group of ramps. There is one exception to be managed when the group ends up aligned with a hardware cycle. There then is no offset on the first ramp of the next group of ramps, which corresponds to data item Offset equal to 0.

Interpretation module 42 also manages the end of a waveform. When there are no more points to play, interpretation module 42 will keep the last known point and play it continuously.

Even if data parameter Coeff is stored over 28 bits in output memory 60, it may be advantageous for interpolation module 44 to only read the 14 most significant bits of data parameter Coeff from output memory 60, for example to be compatible with frequency fhard. When the data parameter Coeff to be stored in output memory 60 is between −1 and 0, it must be rounded to 0. When data parameter Coeff is negative and greater than −1, these 14 most significant bits are rounded off to −1, even if it is actually very close to 0. To avoid bounce effects (since the value in the buffer is effectively updated with the coefficient over 28 bits), data parameter Coeff is thus rather rounded off to 0 in this case.

As an example, at the fourth hardware cycle, during the execution of the waveform of the above-described Table 7, fetch module 44 indicates to interpretation module 42 that two additional ramps will be necessary to complete the hardware cycle by supplying interpretation module 42 with data item next_index, equal to the data item current_index of the above-described Table 24. Interpretation module 42 thus reads the data parameters of the next two ramps from the above-described Table 23. With the data stored in processing memory 56, which corresponds to the data in the above-described Table 22, processing module 42 determines a set of values comprising data item Value equal to 4,192, data item Coeff equal to −1,451, data item Offset equal to 1, and data item Dur equal to 0 since data parameter Rest is equal to 1. Then, since the data parameter Rest of the next first ramp is equal to 2 (first row of Table 23), processing module 42 determines that the next first ramp is played only once and determines a set of values comprising data item Value equal to 1,290, data item Coeff equal to 1,612, data item Offset equal to 0, and data item Dur equal to 0. Since the data parameter Rest of the next second ramp is equal to 1 (second row of Table 23), processing module 42 determines that the next second ramp is played until the end of the fourth hardware cycle and also at the next cycle. At the fourth cycle, processing module 42 thus determines two sets of values, each comprising data item Value equal to 2,902, data item Coeff equal to −414.57, data item Offset equal to 0, and data item Dur respectively equal to 0 and Tdac. For the fifth cycle which will follow, processing module 42 updates the data in processing memory 56, which corresponds to the data in the above-described Table 25. Since the ramp defined by the data of processing memory 56 has already been played twice, the interpretation module has set data item Offset to 2.

Figure 18:
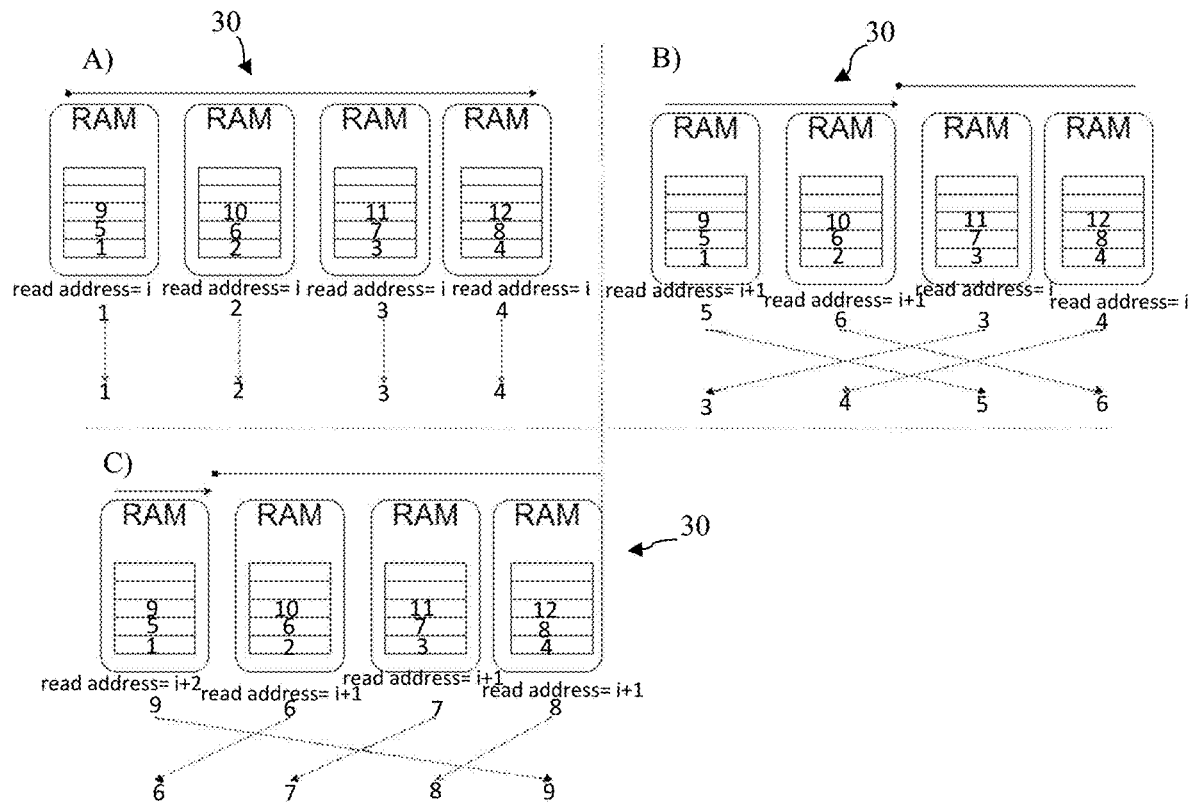
FIG. 18 illustrates an embodiment of a method of managing a memory of the electronic circuit of FIG. 10.

FIG. 18 illustrates an embodiment of a method of operation of first buffer memory 50 and of second buffer memory 52. In FIG. 18, Nout is equal to 4, so that the data memory is implemented as 4 memory blocks in parallel. Since interpretation module 42 reads with a sliding window which is not aligned with the 4 memory blocks, the data must be realigned. Fetch module 44 determines the value of the shift shift_data necessary for the realignment. In case A), the shift value is equal to 0. In case B), the shift value is equal to 2. In case C), the shift value is equal to 3.

Figure 19:
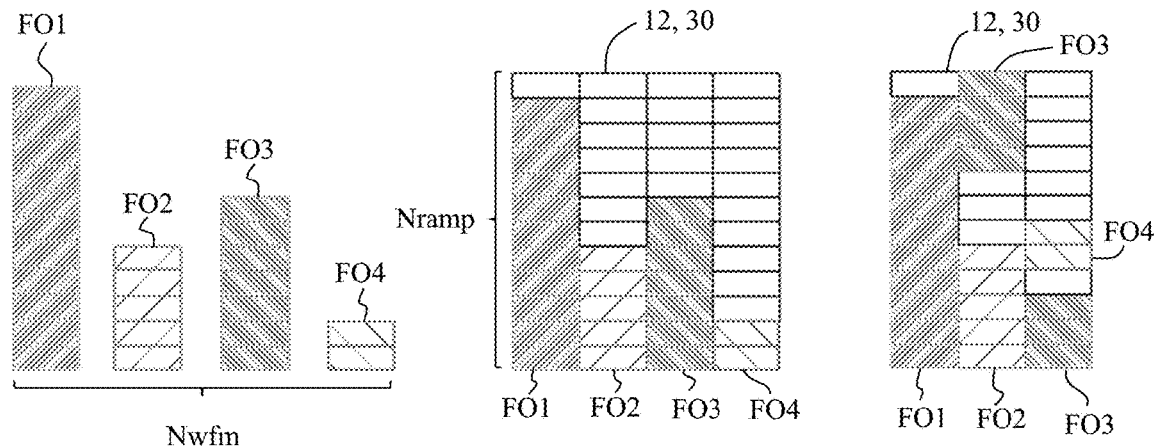
FIG. 19 illustrates another embodiment of a method of managing a memory of the electronic circuit of FIG. 10.

FIG. 19 illustrates an embodiment of a method of managing memories 30 and 32. The number of usable waveforms is called Nwfm and the maximum possible number of ramps per waveform is called Nramp. On the left-hand side of FIG. 19, four waveforms FO1, FO2, FO3, FO4 which are desired to be played have been very schematically shown. In the central portion of FIG. 19, memory 12, 30 has been shown, having the data of the four waveforms FO1, FO2, FO3, FO4 non-optimally stored therein. The size of memory 12, 30 is then equal to product Nwfm*Nramp. In the central portion of FIG. 19, memory 12, 30 has been shown, having the data of the four waveforms FO1, FO2, FO3, FO4 optimally stored therein. The size of memory 12, 30 may then be smaller than product Nwfm*Nramp.

In the above-described embodiments, decoding circuit 20 and execution circuit 40 are each implemented by a dedicated electronic circuit. According to another embodiment, only execution circuit 40 is implemented by a dedicated electronic circuit, and decoding circuit 20 comprises a processor, for example a microprocessor or microcontroller, configured to execute computer program instructions stored in a memory.

The previously described embodiments concern waveforms comprising linear ramps. According to another embodiment, each ramp of the waveform may follow a polynomial function P(x) according to the following relation:

$$P(x) = \text{Start\_value} + Coeff1*x + Coeff2*x^2 + \ldots + CoeffD*x^D \quad \text{[Math 5]}$$

where D is the degree of the polynomial and coefficients Coeffj, j varying from 1 to D, are the coefficients of the polynomial. When the degree of the polynomial is equal to 1, the ramp corresponds to a linear ramp. When the degree of the polynomial is greater than or equal to 2, the ramp corresponds to a non-linear ramp.

Figure 20:
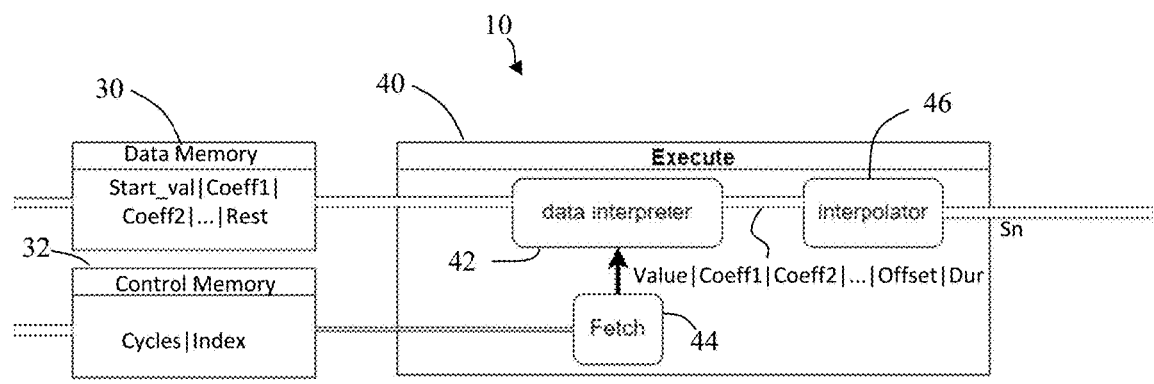
FIG. 20 schematically shows another embodiment of an electronic circuit configured to execute a waveform.

FIG. 20 schematically shows another embodiment of electronic circuit 10 configured to execute a waveform having each ramp following the previously-indicated relation Math 5. In this embodiment, the data parameters stored in memory 30 comprise, for each ramp, the previously-described data parameters Start_val and Rest and, further, coefficients Coeffj, j varying from 1 to D. Interpretation module 42 and fetch module 44 may have the same structure as that previously described, with the difference that the processed data are more significant, since there is a plurality of coefficients Coeffj. Interpolation module 46 supplies each digital value of signal Sn based on the data items Value, Dur, Offset, Coeff1, ... CoeffD supplied by interpretation module 42 according to the following relation.

$$P(x) = \text{Start\_value} + Coeff1*x + Coeff2*x^2 + \ldots + CoeffD*x^D \quad \text{[Math 6]}$$

In particular, when interpolation module 46 is implemented by an FPGA circuit, the calculation of a digital value by interpolation module 46 may take D+1 hardware cycles and require D multipliers.

In the embodiments described hereabove, decoding circuit 20 is configured to supply, at each hardware clock cycle, the data parameters and control parameters of Nout successive ramps of the waveform, and execution circuit 40 is configured to supply, at each hardware clock cycle, Nout digital values of digital signal Sn. According to another embodiment, decoding circuit 20 is configured to provide, at each hardware clock cycle, the data parameters and the control parameters of Nout1 successive ramps of the waveform and execution circuit 40 is configured to provide, at each hardware clock cycle, Nout2 digital values of digital signal Sn, Nout1 and Nout2 being different integers. In particular, Nout1 may be smaller than Nout2. This advantageously enables to simplify the forming of decoder circuit 20.

The digital signal Sn supplied by electronic circuit 10 may be modified before its transmission to digital-to-analog converter 6.

Figure 21:
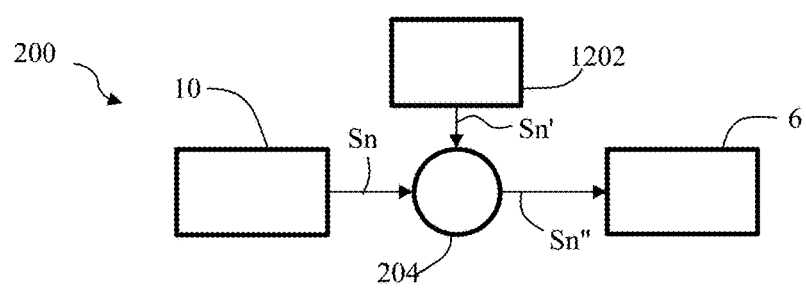
FIG. 21 shows an embodiment of a system for providing a digital signal.

FIG. 21 shows an example of a system 200 for supplying a digital signal Sn". System 200 comprises electronic circuit 10, shown in FIG. 9, which supplies digital signal Sn, and a circuit 202 configured to supply a digital signal Sn'. System 200 further comprises a circuit 204, for example an adder, which receives digital signals Sn and Sn' and supplies digital signal Sn", for example equal to the sum of digital signals Sn and Sn'.

Tests have been carried out. For these tests, electronic circuit 10 is implemented by an FPGA circuit. Parameter Nwfm is equal to 32, parameter Nramp is equal to 256. The size of each memory 12, 30, and 32 is equal to 8,192.

Figure 22:
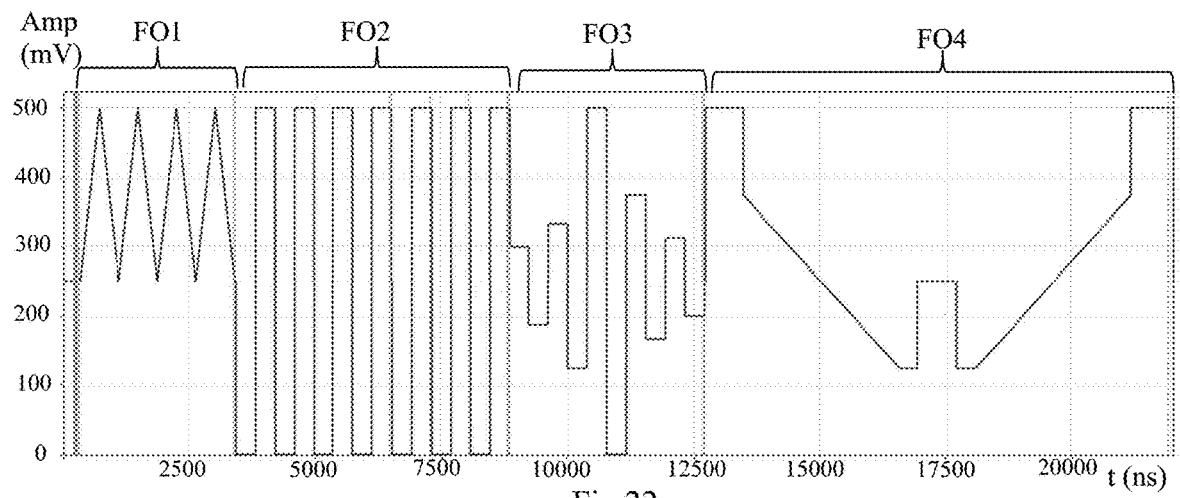
FIG. 22, FIG. 23, and FIG. 24 show examples of waveforms obtained by tests.

FIG. 22 is a timing diagram of four successive waveforms FO1, FO2, FO3, and FO4.

Figure 23:
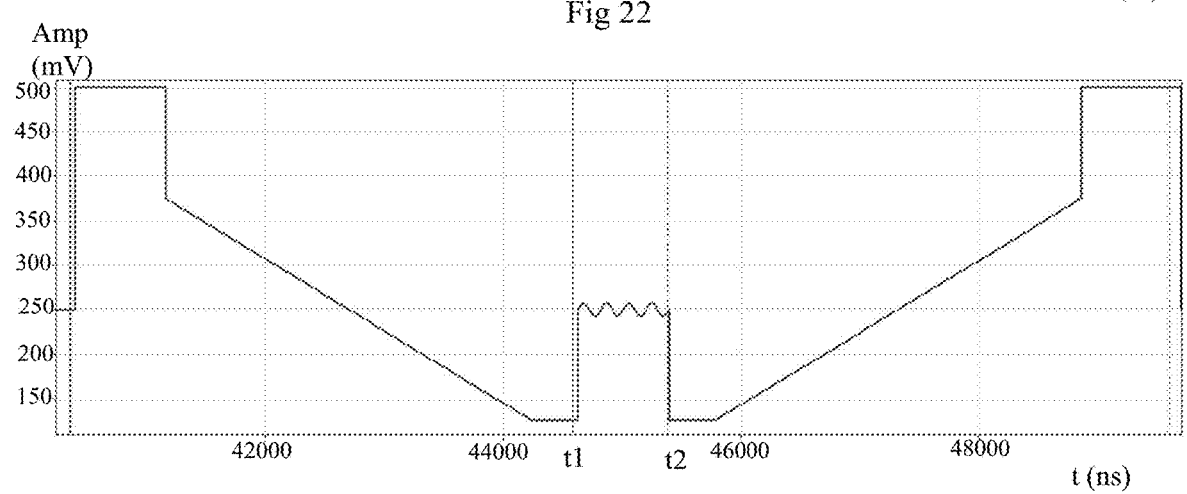

FIG. 23 is a timing diagram of the fourth waveform FO4 of FIG. 22, to which a digital signal having a sinusoidal waveform has been added between times t1 and t2.

Figure 24:
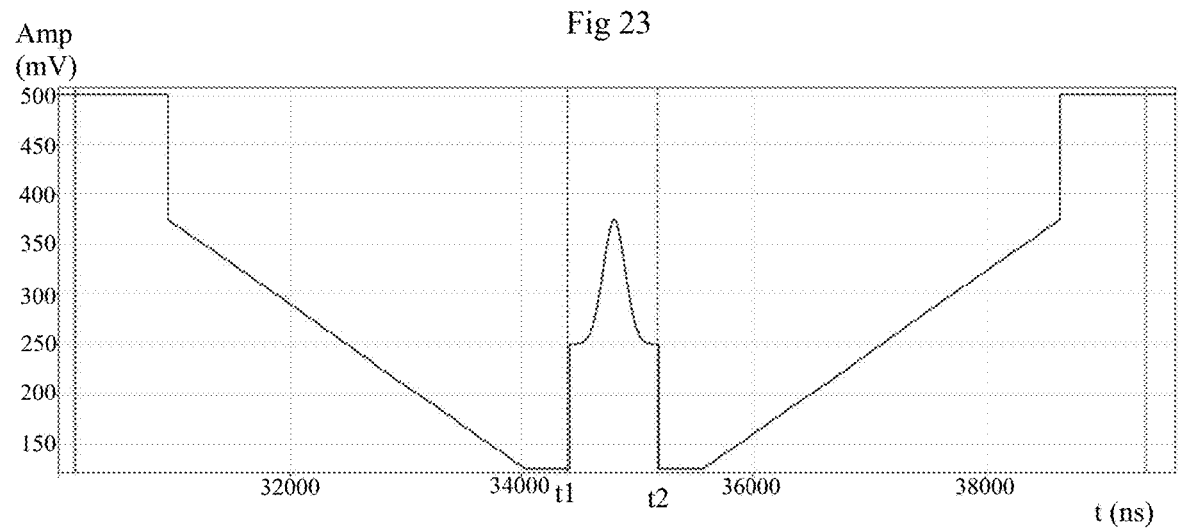

FIG. 24 is a timing diagram of the fourth waveform FO4 of FIG. 22, to which a digital signal having a Gaussian-type waveform has been added between times t1 and t2.

Various embodiments and variants have been described. Those skilled in the art will understand that certain features of these various embodiments and variants may be combined, and other variants will occur to those skilled in the art.

Finally, the practical implementation of the described embodiments and variants is within the abilities of those skilled in the art based on the functional indications given hereabove.

What is claimed is:

1. Electronic circuit for providing a digital signal, an analog signal obtained by digital-to-analog conversion of the digital signal comprising a succession of ramps, the electronic circuit being clocked by a clock signal, the electronic circuit being configured to supply a number Nout of successive digital values of the digital signal at each cycle of the clock signal, Nout being greater than 1, the electronic circuit comprising a first memory in which are stored, for each ramp, first data comprising a start value of the ramp, the slope of the ramp, and a remaining duration of the ramp in the last cycle of the clock signal in which the ramp extends, and a second memory in which are stored second data relative to the numbers of cycles of the clock signal over which some of the ramps extend, and a first circuit configured to read from the first memory the first data relative to a plurality of successive ramps and from the second memory the second data associated with said plurality of successive ramps, and to provide said digital values based on the first and second read data.

2. Electronic circuit according to claim 1, wherein the first circuit is configured to read in parallel from the first memory the first data relative to Nout successive ramps, to read from the second memory the second data associated with said Nout successive ramps, and to supply, at a cycle of the clock signal, Nout digital values of the digital signal forming part of from one to Nout ramps among said Nout ramps.

3. Electronic circuit according to claim 2, wherein the first circuit comprises Nout interpolation circuits in parallel, each interpolation circuit being configured to calculate, at a cycle of the clock signal, one of the Nout digital values of the digital signal forming part of from one to Nout ramps among said Nout successive ramps.

4. Electronic circuit according to claim 1, wherein the first data stored in the first memory comprise, for each ramp, coefficients of a polynomial of a degree greater than or equal to 2, the slope of the ramp being the coefficient of degree 1 of the polynomial, the first circuit being configured to supply said digital values of ramps corresponding to polynomial functions.

5. Electronic circuit according to claim 1, wherein Nout is a power of two, in particular 2, 4, 8, or 16.

6. Electronic circuit according to claim 1, wherein the first circuit is configured to read, from the first memory, simultaneously the first data of Nout successive ramps.

7. Electronic circuit according to claim 1, wherein the first circuit is configured to read, from the second memory, simultaneously the second data of Nout successive ramps.

8. Electronic circuit according to claim 1, in which the first circuit comprises a first module configured to supply, at each cycle of the clock signal, sets of data, each set comprising a start value of the ramp, the slope of the ramp, and a delay, the delay varying from one set to the other, and a second module configured, for each set, to supply a digital value of the digital signal equal to the sum of the start value of the ramp and of the product of the slope of the ramp and of the delay.

9. Electronic circuit according to claim 1, wherein the first memory comprises Nout memory blocks in parallel.

10. Electronic circuit according to claim 1, comprising a third memory in which are stored, for each ramp of the succession of ramps, third data comprising the start value of the ramp, the end value of the ramp, and the duration of the ramp, the electronic circuit further comprising a second circuit configured to supply, based on the third data, the first data and the second data, and to write the first data into the first memory and to write the second data into the second memory.

11. Electronic circuit according to claim 10, wherein the second circuit is configured to process the third data in batches of Nout successive ramps.

12. Electronic circuit according to claim 10, wherein the second circuit comprises a third module configured to determine, for each ramp, the slope of the ramp, and a fourth module configured to determine the total duration elapsed from the start of the succession of ramps to the end of the ramp and the number of cycles of the clock signal contained in said total duration.

13. System comprising the electronic circuit according to claim 1, a digital-to-analog converter configured to convert the digital signal into an analog signal, and quantum bit storage cells receiving the analog signal.

14. Method of supplying a digital signal, an analog signal obtained by digital-to-analog conversion of the digital signal comprising a succession of ramps, the method comprising the supply, at each cycle of a clock signal, of a number Nout of successive digital values of the digital signal, Nout being greater than 1, the method comprising the provision of a first memory in which are stored, for each ramp, first data comprising a start value of the ramp, the slope of the ramp, and a remaining duration of the ramp in the last cycle of the clock signal in which the ramp extends, the provision of a second memory in which are stored second data relative to the numbers of cycles of the clock signal over which some of the ramps extend, the reading, from the first memory, of the first data relative to a plurality of successive ramps and, from the second memory, of the second data associated with said plurality of successive ramps, and the supply of said digital values based on the first and second read data.

* * * * *